(12) United States Patent
Yang et al.

(10) Patent No.: US 12,254,931 B2
(45) Date of Patent: *Mar. 18, 2025

(54) THREE-BIT-PER-CELL PROGRAMMING USING A FOUR-BIT-PER-CELL PROGRAMMING ALGORITHM

(71) Applicant: SanDisk Technologies LLC, Addison, TX (US)

(72) Inventors: Xiang Yang, Santa Clara, CA (US); Deepanshu Dutta, Fremont, CA (US); Jiacen Guo, Sunnyvale, CA (US); Takayuki Inoue, Sagamihara (JP); Hua-Ling Hsu, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 212 days.

This patent is subject to a terminal disclaimer.

(21) Appl. No.: 17/845,060

(22) Filed: Jun. 21, 2022

(65) Prior Publication Data

US 2023/0410921 A1    Dec. 21, 2023

(51) Int. Cl.
*G11C 16/34* (2006.01)
*G11C 7/10* (2006.01)
*G11C 16/10* (2006.01)
*G11C 16/26* (2006.01)

(52) U.S. Cl.
CPC ........ *G11C 16/3454* (2013.01); *G11C 7/1039* (2013.01); *G11C 16/102* (2013.01); *G11C 16/26* (2013.01)

(58) Field of Classification Search
CPC .................................................. G11C 16/3454
See application file for complete search history.

(56) References Cited

U.S. PATENT DOCUMENTS

| | | | |
|---|---|---|---|
| 9,697,892 B1* | 7/2017 | Varanasi | G11C 11/5628 |
| 2006/0221696 A1* | 10/2006 | Li | G11C 16/26 |
| | | | 365/185.12 |
| 2008/0172520 A1* | 7/2008 | Lee | G11C 11/5628 |
| | | | 711/E12.001 |
| 2008/0175048 A1* | 7/2008 | Kang | G11C 16/10 |
| | | | 365/189.05 |
| 2008/0219057 A1* | 9/2008 | Li | G11C 16/0483 |
| | | | 711/103 |
| 2009/0190397 A1* | 7/2009 | Cho | G11C 11/5642 |
| | | | 365/185.18 |
| 2013/0297853 A1* | 11/2013 | Balakrishnan | G06F 12/0866 |
| | | | 711/E12.008 |
| 2015/0078080 A1 | 3/2015 | Lee | |
| 2016/0314039 A1 | 10/2016 | Eisenhuth et al. | |
| 2020/0004440 A1 | 1/2020 | Koudele et al. | |
| 2020/0201569 A1 | 6/2020 | Hsiao et al. | |
| 2022/0101928 A1 | 3/2022 | Lee | |

* cited by examiner

*Primary Examiner* — Douglas King
(74) *Attorney, Agent, or Firm* — PEARL COHEN ZEDEK LATZER BARATZ LLP

(57) ABSTRACT

An apparatus is provided that includes a plurality of memory cells, logic circuits coupled to the memory cells and configured to store 4-bit data in each of the memory cells, and a control circuit coupled to the memory cells and the logic circuits. The control circuit configured to cause the logic circuits to store 3-bit data in each of the memory cells.

20 Claims, 29 Drawing Sheets

Fig. 6A
number of cells / Er / $V_T$

Fig. 6B
number of cells / Er, IM / VvIM / $V_T$

Fig. 6C
number of cells / Er, IM / Er, A, B, C, D, E, F, G / Vv1', Vv2', Vv3', Vv4', Vv5', Vv6', Vv7' / $V_T$

Fig. 6D
number of cells / Er, A, B, C, D, E, F, G / Vv1, Vv2, Vv3, Vv4, Vv5, Vv6, Vv7 / $V_T$

Fig. 6E
number of cells / Er, A, B, C, D, E, F, G / $V_T$

FIG. 9A1 (900a1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 9A2 (900a2)

| | "Er" | "A" | "B" | "C" | "D" | "E" | "F" | "G" |
|---|---|---|---|---|---|---|---|---|
| | S0 | S1 | S8 | S9 | S12 | S13 | S14 | S15 |
| TP | 1 | 0 | 0 | 0 | 0 | 1 | 1 | 1 |
| UP | 1 | 1 | 1 | 1 | 1 | 1 | 1 | 1 |
| MP | 1 | 1 | 1 | 0 | 0 | 0 | 0 | 1 |
| LP | 1 | 1 | 0 | 0 | 1 | 1 | 0 | 0 |

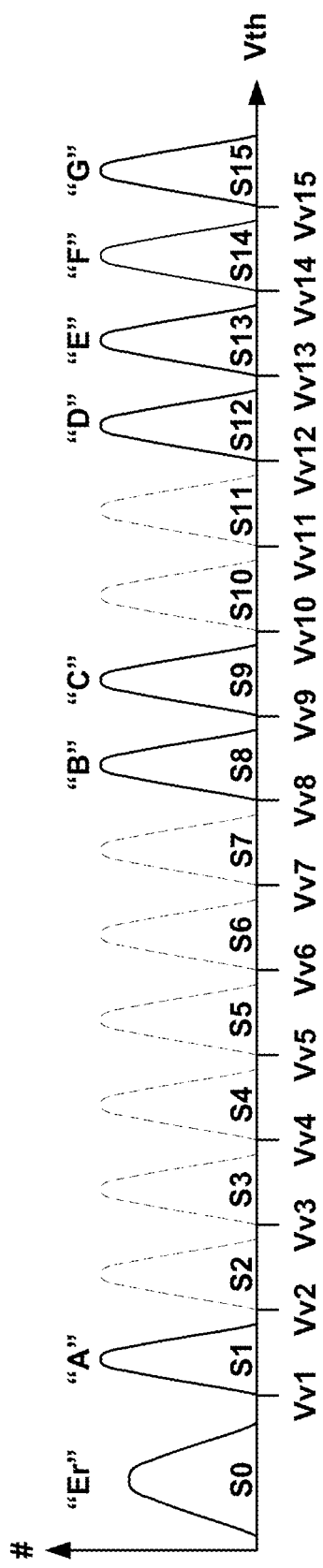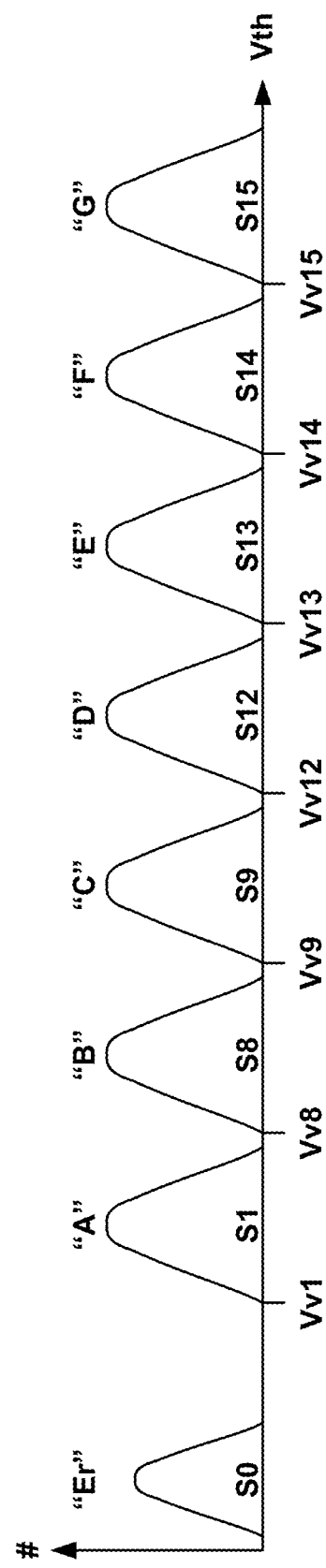

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 1 | 0 | 0 | 0 | 0 | 1 | 1 | 0 | 0 | 1 | 1 | 1 | 1 |
| MP | 1 | 1 | 1 | 0 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

| | "Er" | "A" | "B" | "C" | "D" | "E" | "F" | "G" |
|---|---|---|---|---|---|---|---|---|
| | S2 | S3 | S4 | S5 | S6 | S7 | S10 | S11 |
| TP | 0 | 1 | 1 | 1 | 1 | 0 | 0 | 0 |
| UP | 0 | 0 | 0 | 0 | 0 | 0 | 0 | 0 |
| MP | 1 | 1 | 0 | 0 | 1 | 1 | 0 | 0 |
| LP | 1 | 1 | 1 | 0 | 0 | 0 | 0 | 1 |

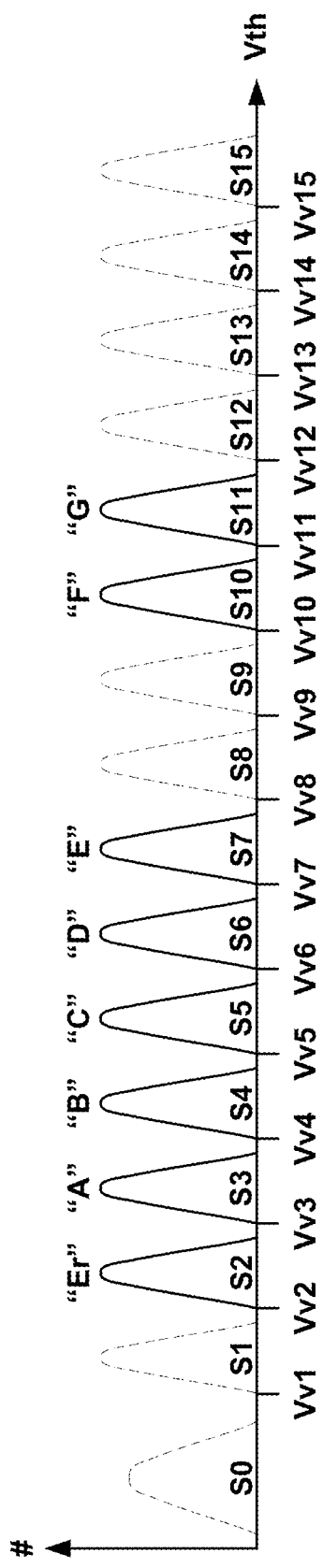
FIG. 9B3
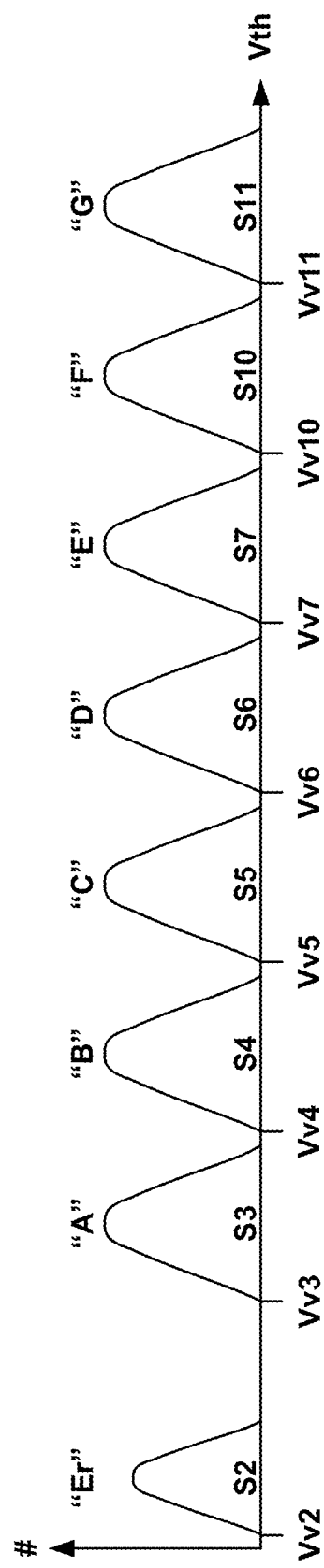
FIG. 9B4

900c1

| | $\overline{S0}$ | S1 | S2 | $\overline{S3}$ | $\overline{S4}$ | $\overline{S5}$ | $\overline{S6}$ | S7 | S8 | S9 | S10 | S11 | S12 | $\overline{S13}$ | $\overline{S14}$ | $\overline{S15}$ |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

| | "Er" | "A" | "B" | "C" | "D" | "E" | "F" | "G" |
|---|---|---|---|---|---|---|---|---|
| | S0 | S3 | S4 | S5 | S6 | S13 | S14 | S15 |
| TP | 1 | 1 | 1 | 1 | 1 | 1 | 1 | 1 |
| UP | 1 | 0 | 0 | 0 | 0 | 1 | 1 | 1 |
| MP | 1 | 1 | 0 | 0 | 1 | 0 | 0 | 1 |
| LP | 1 | 1 | 1 | 0 | 0 | 1 | 0 | 0 |

FIG. 9C2

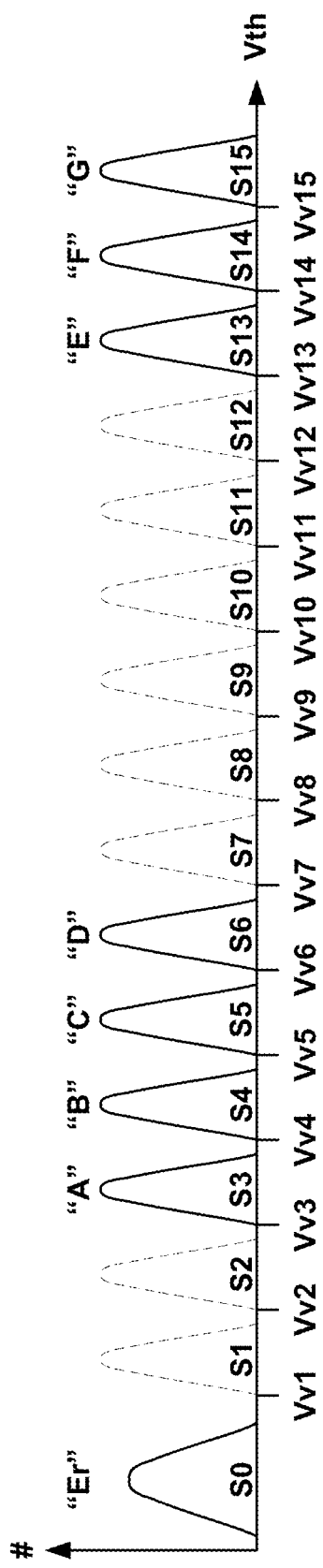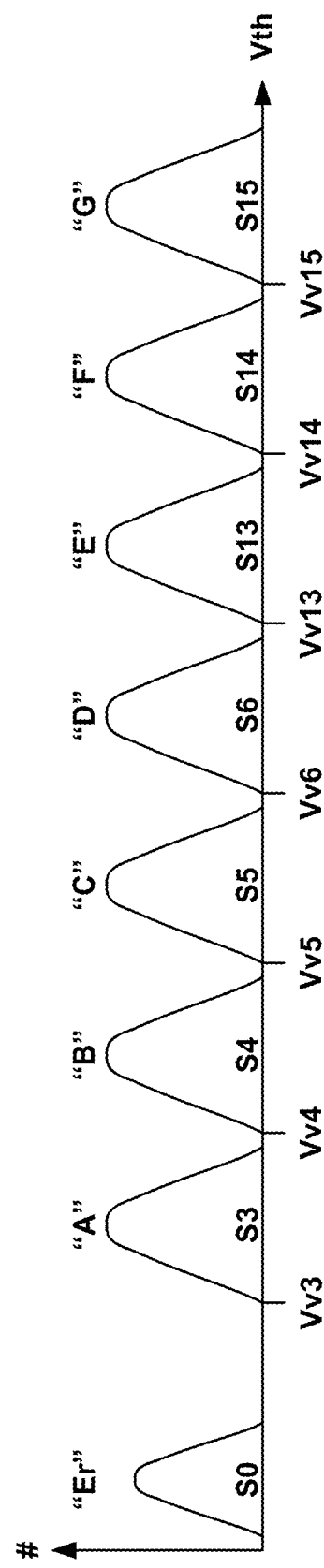

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

| | "Er" | "A" | "B" | "C" | "D" | "E" | "F" | "G" |
|---|---|---|---|---|---|---|---|---|
| | S1 | S2 | S7 | S8 | S9 | S10 | S11 | S12 |
| TP | 0 | 0 | 0 | 0 | 0 | 0 | 0 | 0 |
| UP | 1 | 0 | 0 | 1 | 1 | 0 | 0 | 1 |
| MP | 1 | 1 | 1 | 1 | 0 | 0 | 0 | 0 |
| LP | 1 | 1 | 0 | 0 | 0 | 0 | 1 | 1 |

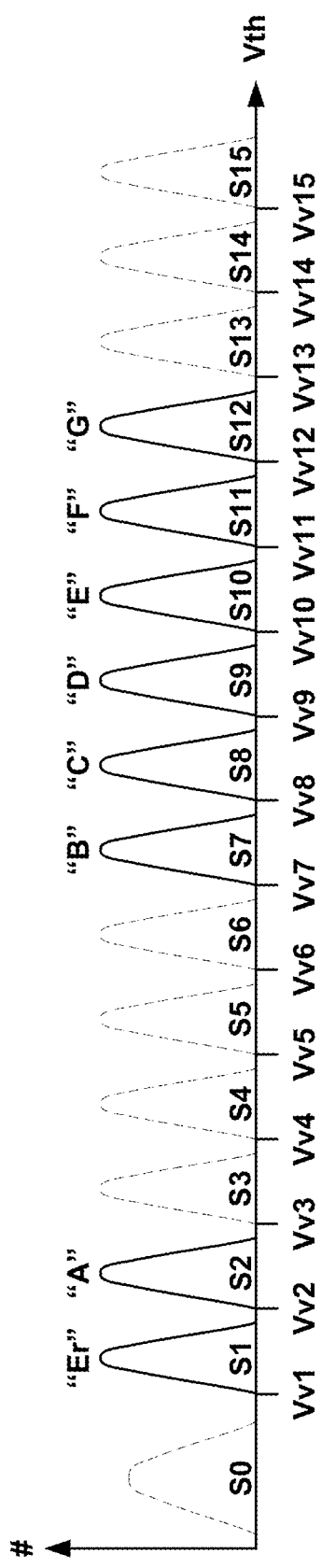
FIG. 9D3
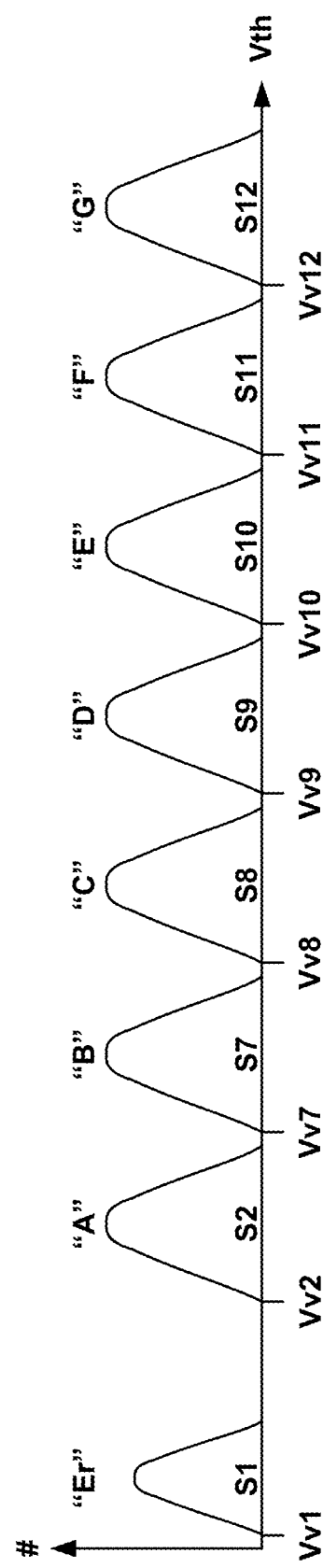
FIG. 9D4

FIG. 9E1 (900e1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 1 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 0 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 9E2 (900e2)

| | "Er" | "A" | "B" | "C" | "D" | "E" | "F" | "G" |
|---|---|---|---|---|---|---|---|---|
| | S0 | S1 | S2 | S3 | S6 | S7 | S8 | S15 |
| TP | 1 | 0 | 0 | 1 | 1 | 0 | 0 | 1 |
| UP | 1 | 1 | 0 | 0 | 0 | 0 | 1 | 1 |
| MP | 1 | 1 | 1 | 1 | 1 | 1 | 1 | 1 |
| LP | 1 | 1 | 1 | 1 | 0 | 0 | 0 | 0 |

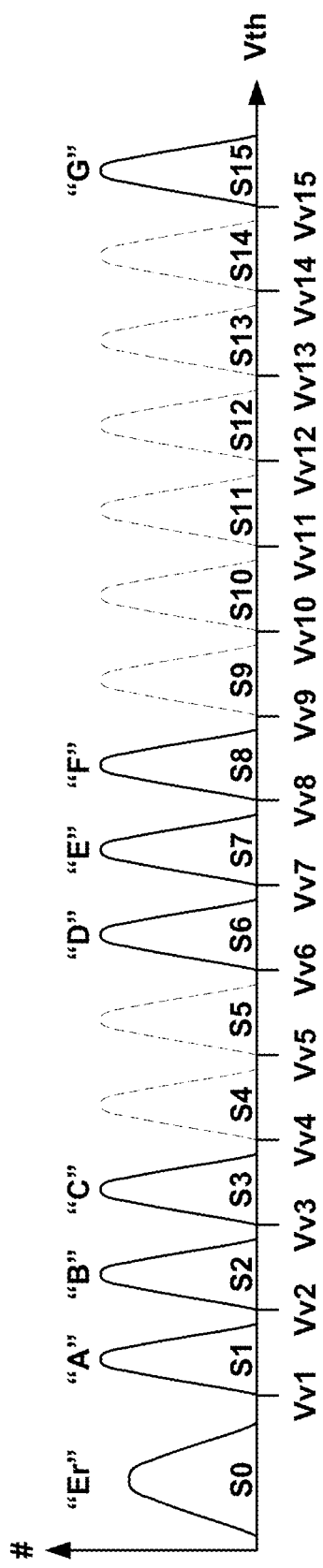
FIG. 9E3
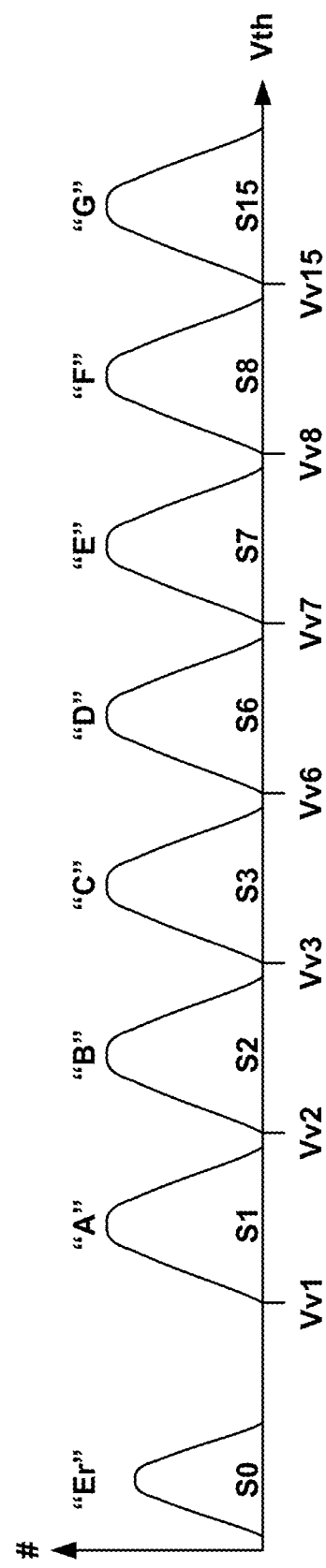
FIG. 9E4

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 0 | 1 | 1 | 0 | 0 |

| | "Er" S4 | "A" S5 | "B" S9 | "C" S10 | "D" S11 | "E" S12 | "F" S13 | "G" S14 |
|---|---|---|---|---|---|---|---|---|
| TP | 1 | 1 | 0 | 0 | 0 | 0 | 1 | 1 |
| UP | 0 | 0 | 1 | 0 | 0 | 1 | 1 | 1 |
| MP | 0 | 0 | 0 | 0 | 0 | 0 | 0 | 0 |
| LP | 1 | 0 | 0 | 0 | 1 | 1 | 1 | 0 |

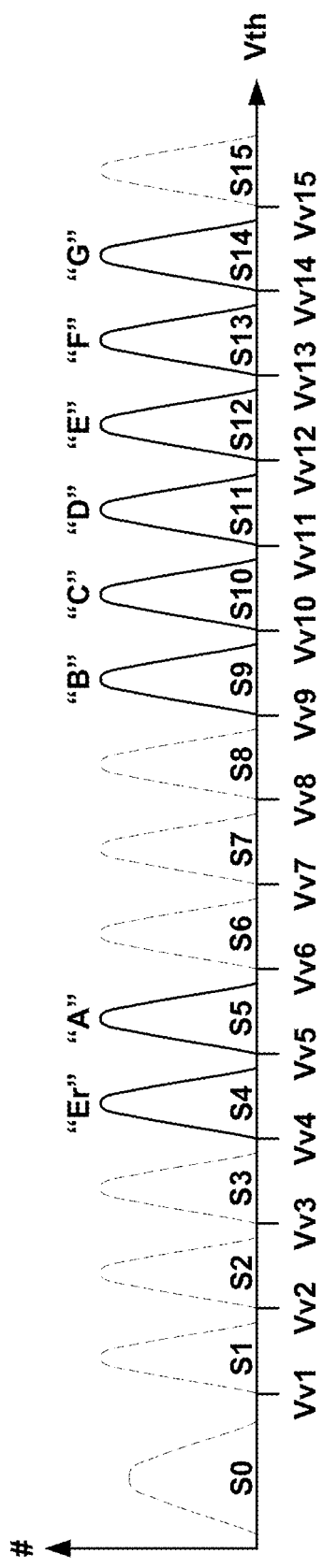
FIG. 9F3
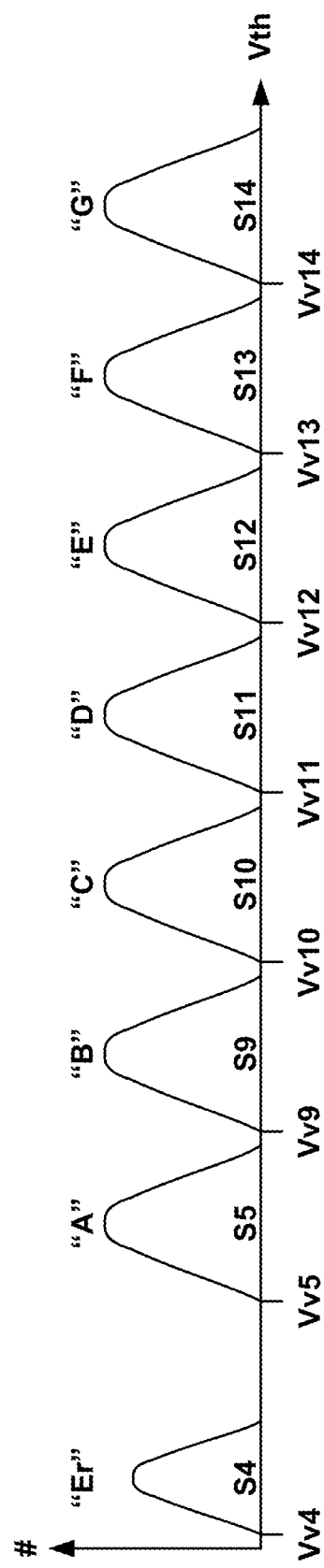
FIG. 9F4

FIG. 9G1 (900g1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 9G2 (900g2)

| | "Er" S0 | "A" S1 | "B" S2 | "C" S3 | "D" S4 | "E" S11 | "F" S12 | "G" S13 |
|---|---|---|---|---|---|---|---|---|
| TP | 1 | 0 | 0 | 1 | 1 | 0 | 0 | 1 |
| UP | 1 | 1 | 0 | 0 | 0 | 0 | 1 | 1 |
| MP | 1 | 1 | 1 | 1 | 0 | 0 | 0 | 0 |
| LP | 1 | 1 | 1 | 1 | 1 | 1 | 1 | 1 |

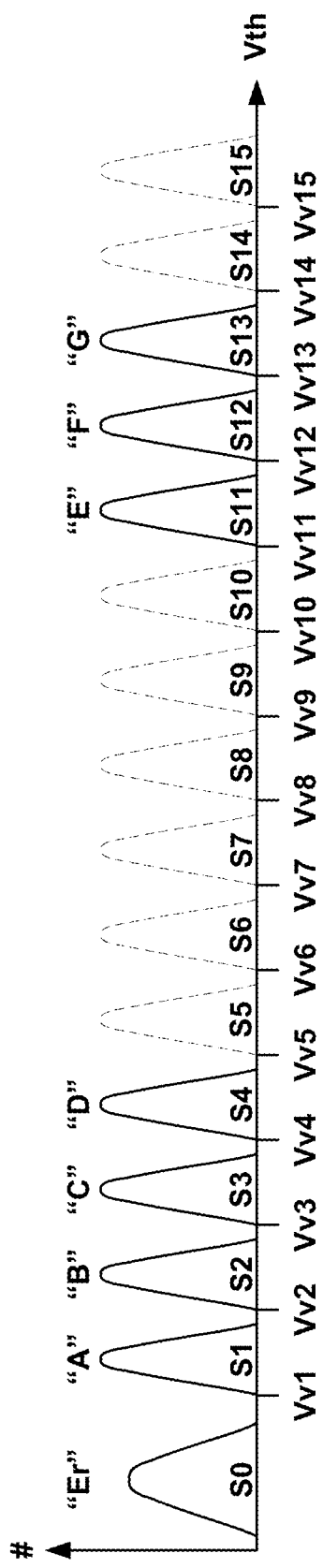
FIG. 9G3
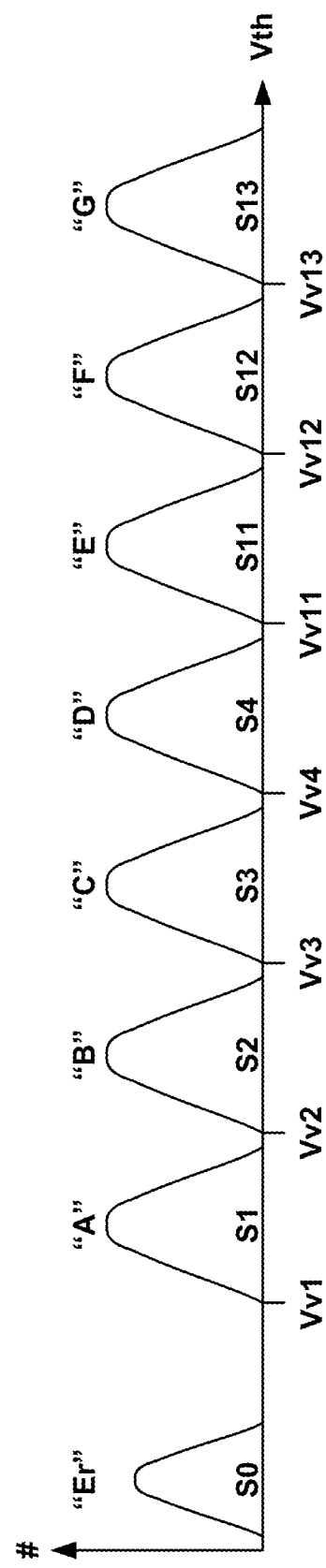
FIG. 9G4

900h1

| | S0 | S1 | S2 | S3 | S4 | (S5) | (S6) | (S7) | (S8) | (S9) | (S10) | S11 | S12 | S13 | (S14) | (S15) |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 0 | 1 | 0 | 0 | 1 | 1 | 1 | 1 |
| MP | 1 | 1 | 1 | 1 | 0 | 0 | 1 | 0 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

| | "Er" S5 | "A" S6 | "B" "C" S7 | "C" "D" S8 | "D" S9 | "E" S10 | "F" S14 | "G" S15 |
|---|---|---|---|---|---|---|---|---|
| TP | 1 | 1 | 0 | 0 | 0 | 0 | 1 | 1 |
| UP | 0 | 0 | 0 | 1 | 1 | 0 | 1 | 1 |
| MP | 0 | 1 | 1 | 1 | 0 | 0 | 0 | 1 |
| LP | 0 | 0 | 0 | 0 | 0 | 0 | 0 | 0 |

FIG. 9H2

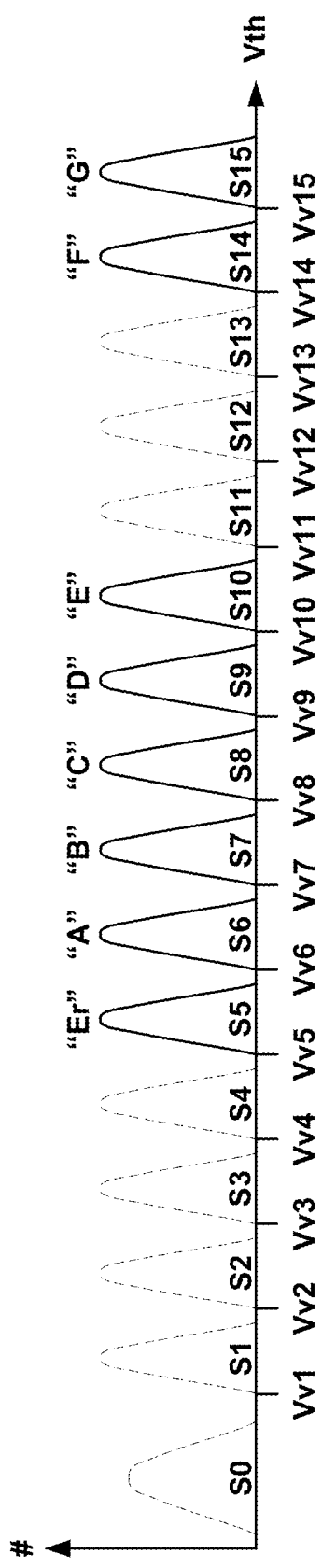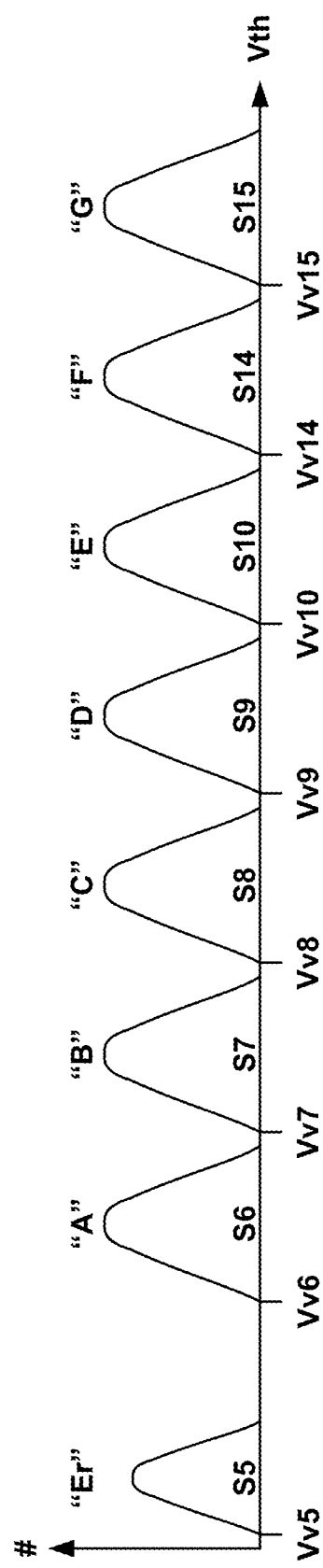

US 12,254,931 B2

THREE-BIT-PER-CELL PROGRAMMING USING A FOUR-BIT-PER-CELL PROGRAMMING ALGORITHM

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

FIGS. 6A-6E depict various threshold voltage distributions and describe a process for programming non-volatile memory.

FIG. 9A1 is a table of an example gray code used to represent sixteen data states.

FIG. 9A2 is a table of an example gray code used top represent eight data states which may be generated from the example gray code of FIG. 9A1.

FIG. 9A3 depicts an embodiment of threshold voltage distributions for an eight-state memory device in which each memory cell stores three bits of data, programmed using the example gray code of FIG. 9A2.

FIG. 9A4 depicts an embodiment of threshold voltage distributions for an eight-state memory device in which each memory cell stores three bits of data, programmed using the example gray code of FIG. 9A2 with tuned verify levels.

FIG. 9B1 is a table of an example gray code used to represent sixteen data states.

FIG. 9B2 is a table of an example gray code used top represent eight data states which may be generated from the example gray code of FIG. 9B1.

FIG. 9B3 depicts an embodiment of threshold voltage distributions for an eight-state memory device in which each memory cell stores three bits of data, programmed using the example gray code of FIG. 9B2.

FIG. 9B4 depicts an embodiment of threshold voltage distributions for an eight-state memory device in which each memory cell stores three bits of data, programmed using the example gray code of FIG. 9B2 with tuned verify levels.

FIG. 9C1 is a table of an example gray code used to represent sixteen data states.

FIG. 9C2 is a table of an example gray code used top represent eight data states which may be generated from the example gray code of FIG. 9C1.

FIG. 9C3 depicts an embodiment of threshold voltage distributions for an eight-state memory device in which each memory cell stores three bits of data, programmed using the example gray code of FIG. 9C2.

FIG. 9C4 depicts an embodiment of threshold voltage distributions for an eight-state memory device in which each memory cell stores three bits of data, programmed using the example gray code of FIG. 9C2 with tuned verify levels.

FIG. 9D1 is a table of an example gray code used to represent sixteen data states.

FIG. 9D2 is a table of an example gray code used top represent eight data states which may be generated from the example gray code of FIG. 9D1.

FIG. 9D3 depicts an embodiment of threshold voltage distributions for an eight-state memory device in which each memory cell stores three bits of data, programmed using the example gray code of FIG. 9D2.

FIG. 9D4 depicts an embodiment of threshold voltage distributions for an eight-state memory device in which each memory cell stores three bits of data, programmed using the example gray code of FIG. 9D2 with tuned verify levels.

FIG. 9E1 is a table of an example gray code used to represent sixteen data states.

FIG. 9E2 is a table of an example gray code used top represent eight data states which may be generated from the example gray code of FIG. 9E1.

FIG. 9E3 depicts an embodiment of threshold voltage distributions for an eight-state memory device in which each memory cell stores three bits of data, programmed using the example gray code of FIG. 9E2.

FIG. 9E4 depicts an embodiment of threshold voltage distributions for an eight-state memory device in which each memory cell stores three bits of data, programmed using the example gray code of FIG. 9E2 with tuned verify levels.

FIG. 9F1 is a table of an example gray code used to represent sixteen data states.

FIG. 9F2 is a table of an example gray code used top represent eight data states which may be generated from the example gray code of FIG. 9F1.

FIG. 9F3 depicts an embodiment of threshold voltage distributions for an eight-state memory device in which each memory cell stores three bits of data, programmed using the example gray code of FIG. 9F2.

FIG. 9F4 depicts an embodiment of threshold voltage distributions for an eight-state memory device in which each memory cell stores three bits of data, programmed using the example gray code of FIG. 9F2 with tuned verify levels.

FIG. 9G1 is a table of an example gray code used to represent sixteen data states.

FIG. 9G2 is a table of an example gray code used top represent eight data states which may be generated from the example gray code of FIG. 9G1.

FIG. 9G3 depicts an embodiment of threshold voltage distributions for an eight-state memory device in which each memory cell stores three bits of data, programmed using the example gray code of FIG. 9G2.

FIG. 9G4 depicts an embodiment of threshold voltage distributions for an eight-state memory device in which each memory cell stores three bits of data, programmed using the example gray code of FIG. 9G2 with tuned verify levels.

FIG. 9H1 is a table of an example gray code used to represent sixteen data states.

FIG. 9H2 is a table of an example gray code used top represent eight data states which may be generated from the example gray code of FIG. 9H1.

FIG. 9H3 depicts an embodiment of threshold voltage distributions for an eight-state memory device in which each memory cell stores three bits of data, programmed using the example gray code of FIG. 9H2.

FIG. 9H4 depicts an embodiment of threshold voltage distributions for an eight-state memory device in which each memory cell stores three bits of data, programmed using the example gray code of FIG. 9H2 with tuned verify levels.

DETAILED DESCRIPTION

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology.

Technology is described for providing a single memory die that includes memory cells that may be programmed as 3-bit-per-cell or 4-bit-per-cell memory cells using logic circuits configured to implement functions to store 4-bit data. In an embodiment, the logic circuits implement a 4-bit-per-cell programming algorithm to program 4-bit data in each memory cell. In an embodiment, the logic circuits also implement a 3-bit-per-cell programming algorithm based on the 4-bit-per-cell programming algorithm to program 3-bit data in each memory cell.

Figure 1:
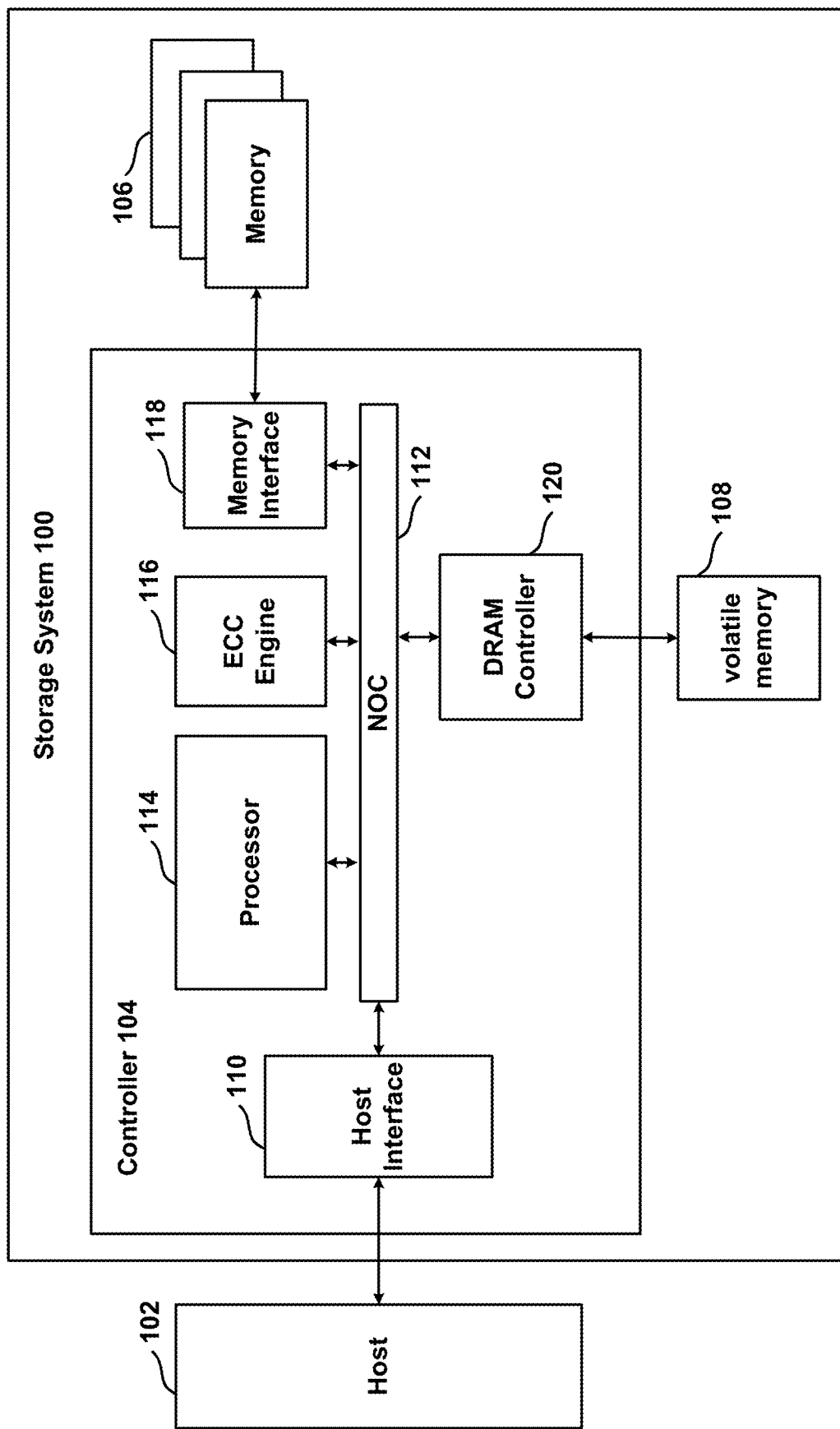
FIG. 1 is a block diagram depicting one embodiment of a memory system.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure.

In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
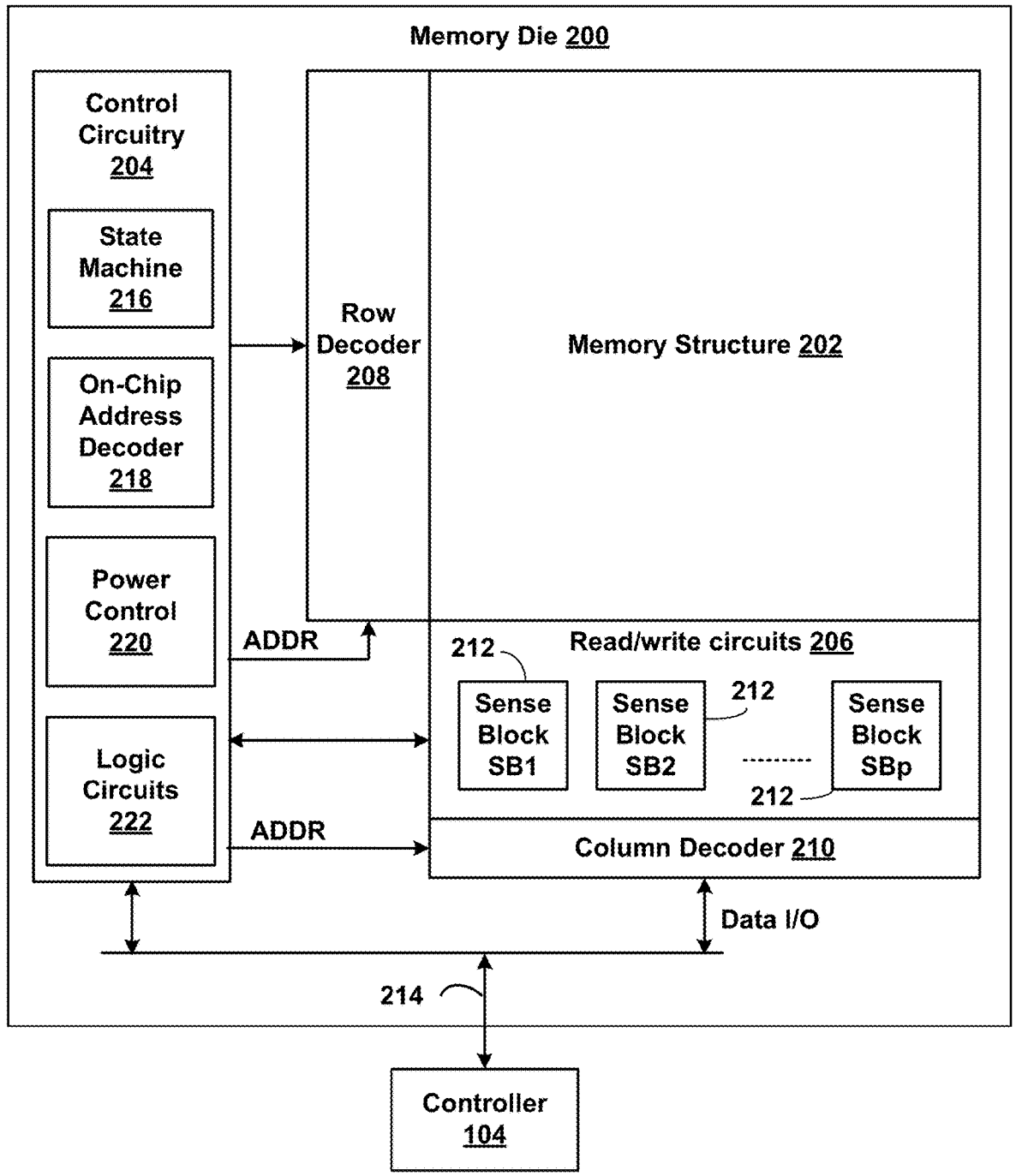
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, SBp (sensing circuitry) and allow a page (or multiple pages) of data in multiple memory cells to be read or programmed (written) in parallel. In an embodiment, each sense block 212 includes a sense amplifier and a set of data latches associated with the memory cell connected to the bit line. The data latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

When a program command is issued, the write data are stored in the data latches associated with the memory cells. For example, in a three-bit per cell memory device, each memory cell is associated with three data latches (e.g., UP, MP, LP) that store the three-bit write data for the memory cell. Similarly, in a four-bit per cell memory device, each memory cell is associated with four data latches (e.g., TP, UP, MP, LP) that store the four-bit write data for the memory cell.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, a power control circuit 220, and logic circuits 222. In an embodiment, state machine 216 provides die-level control of memory operations. In an embodiment, state machine 216 is programmable by software.

In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

In an embodiment, logic circuits 222 include digital circuits that implement functions to store data in memory cells of memory structure 202. In an embodiment, logic circuits 222 include digital circuits that implement functions to store 1-bit data in memory cells of memory structure 202. In an embodiment, logic circuits 222 include digital circuits that implement functions to store 2-bit data in memory cells of memory structure 202. In an embodiment, logic circuits 222 include digital circuits that implement functions to store 3-bit data in memory cells of memory structure 202. In an embodiment, logic circuits 222 include digital circuits that implement functions to store 4-bit data in memory cells of memory structure 202. In other embodiments, logic circuits 222 include digital circuits that implement functions to store 5 or more-bit data in memory cells of memory structure 202.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
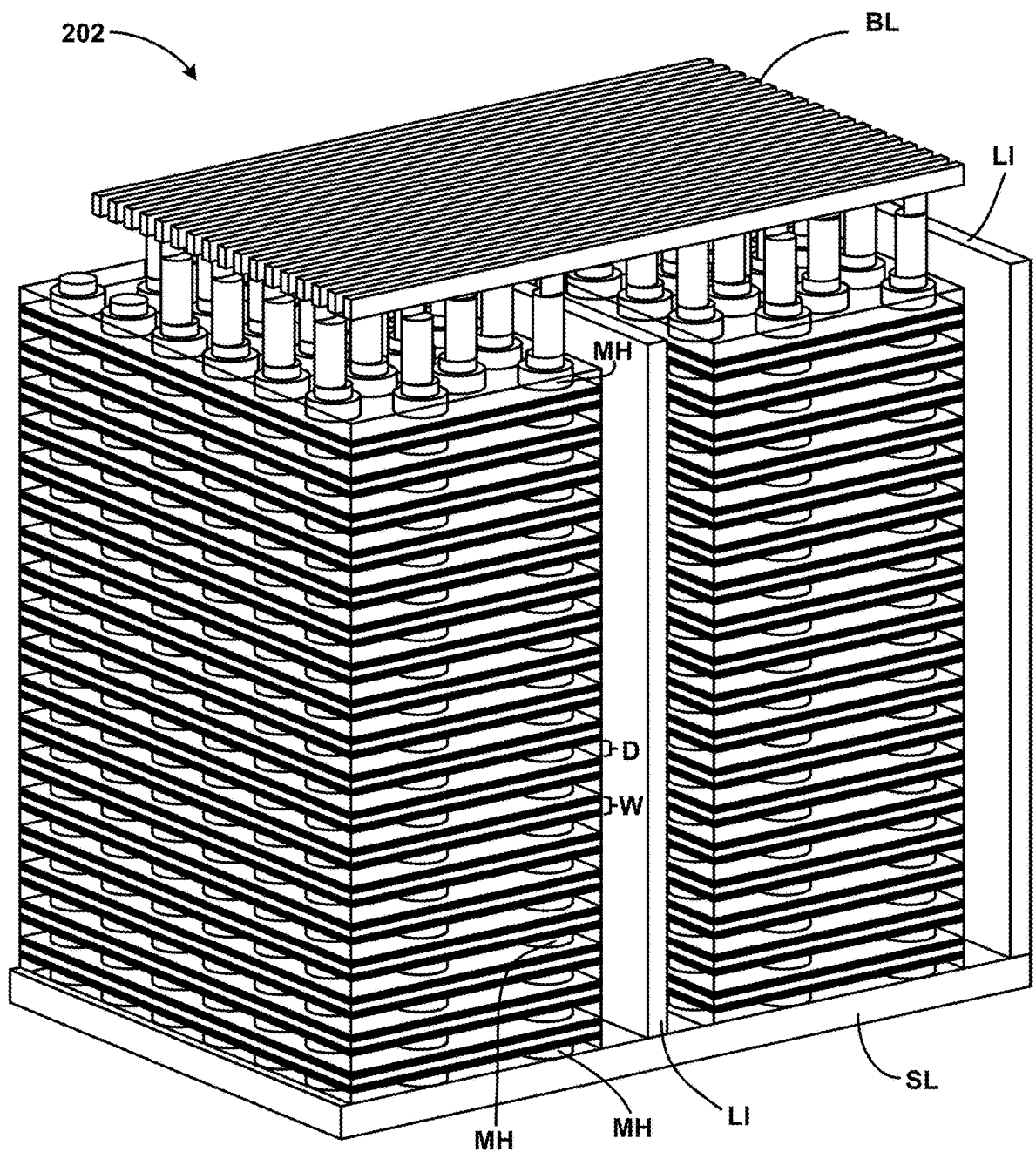
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
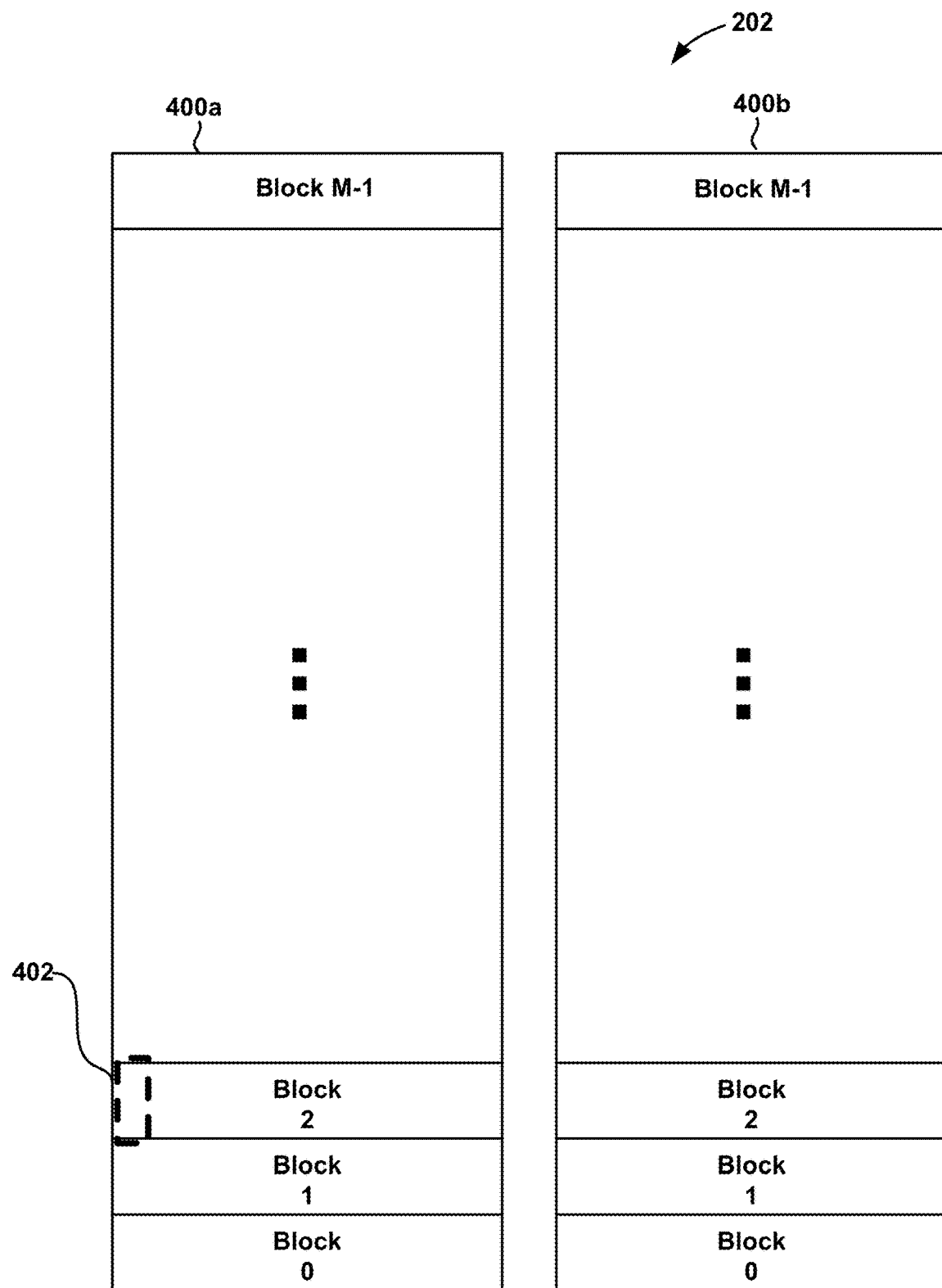
FIG. 4A is a block diagram of a memory structure having two planes.

FIG. 4A is a block diagram explaining one example organization of memory structure 202, which is divided into two planes 400a and 400b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
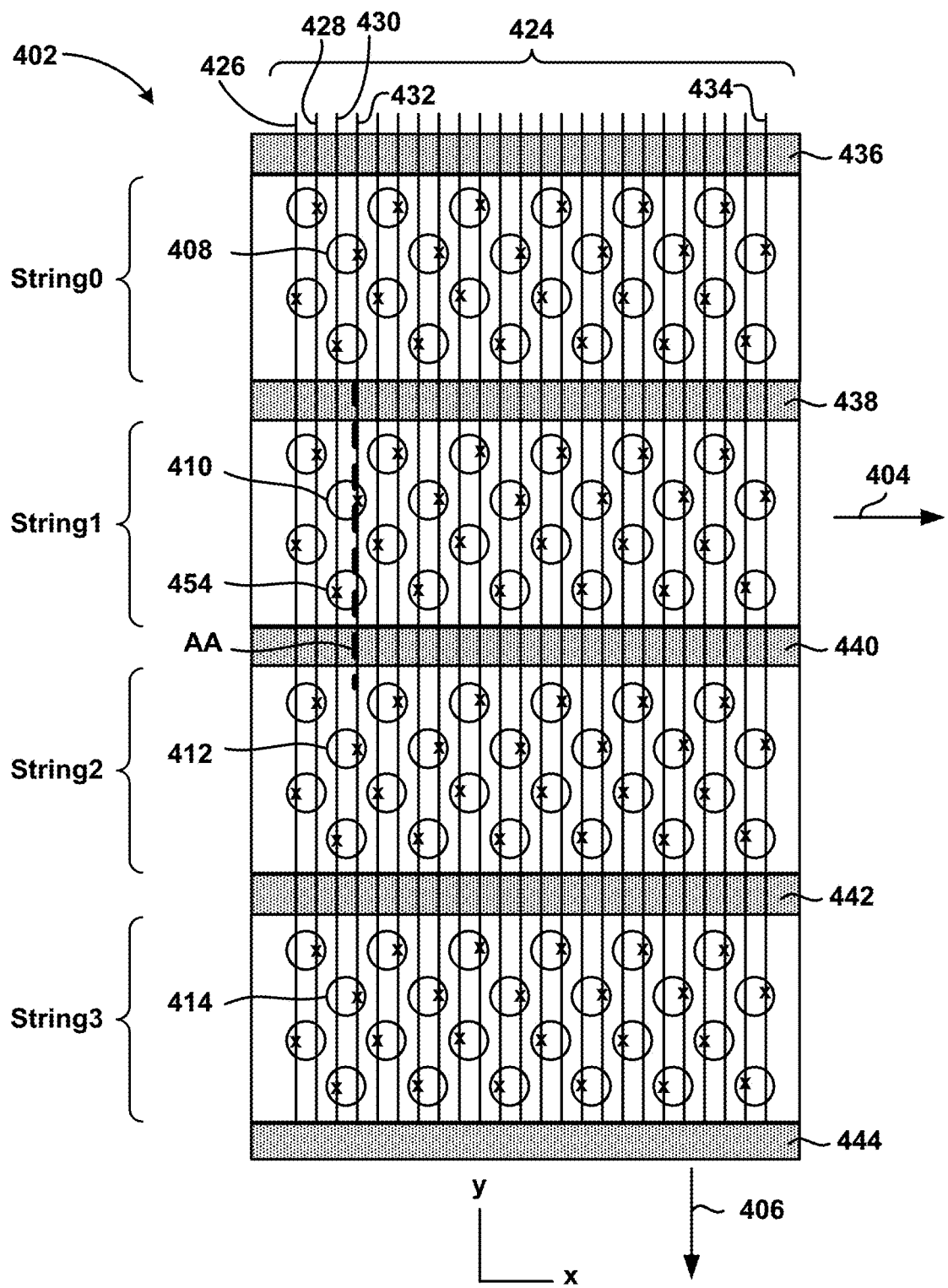
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, Sting2 and String3. In the layers of the block that implement memory cells, String0, String1, Sting2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, Sting2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, Sting2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
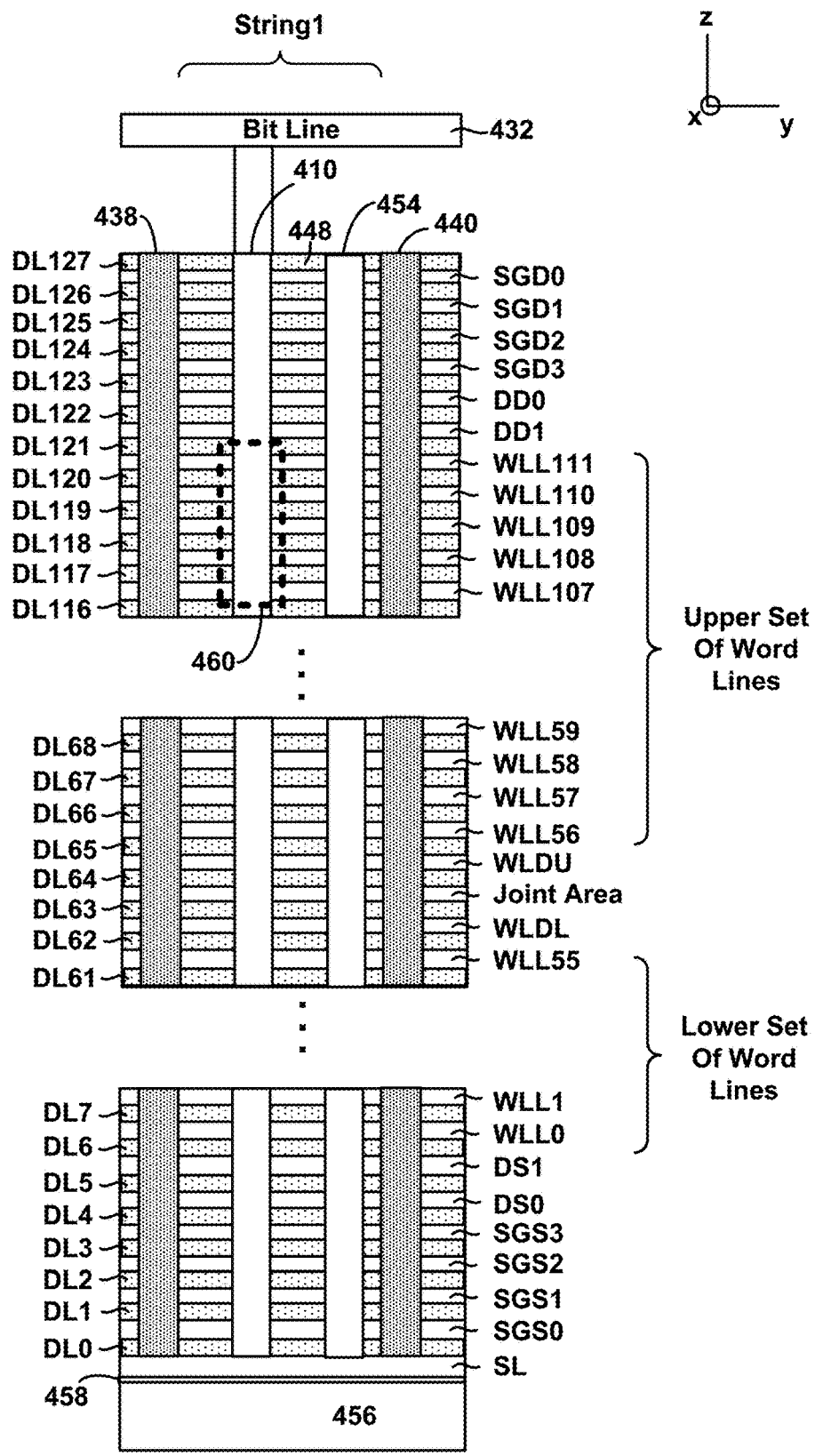
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross sectional view cuts through memory holes 410 and 454 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twelve data word line layers WLL0-WLL111 for connecting to memory cells. Other embodiments can implement more or less than four drain side select layers, more or less than four source side select layers, more or less than six dummy word line layers, and more or less than one hundred and twelve word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL111 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL127. For example, dielectric layer DL120 is above word line layer WLL110 and below word line layer WLL111. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL111 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twelve word line layers intermixed with dielectric layers. To ease this burden, one embodiment includes laying down a first stack of fifty-six word line layers alternating with dielectric layers, laying down the Joint Area, and laying down a second stack of fifty-six word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
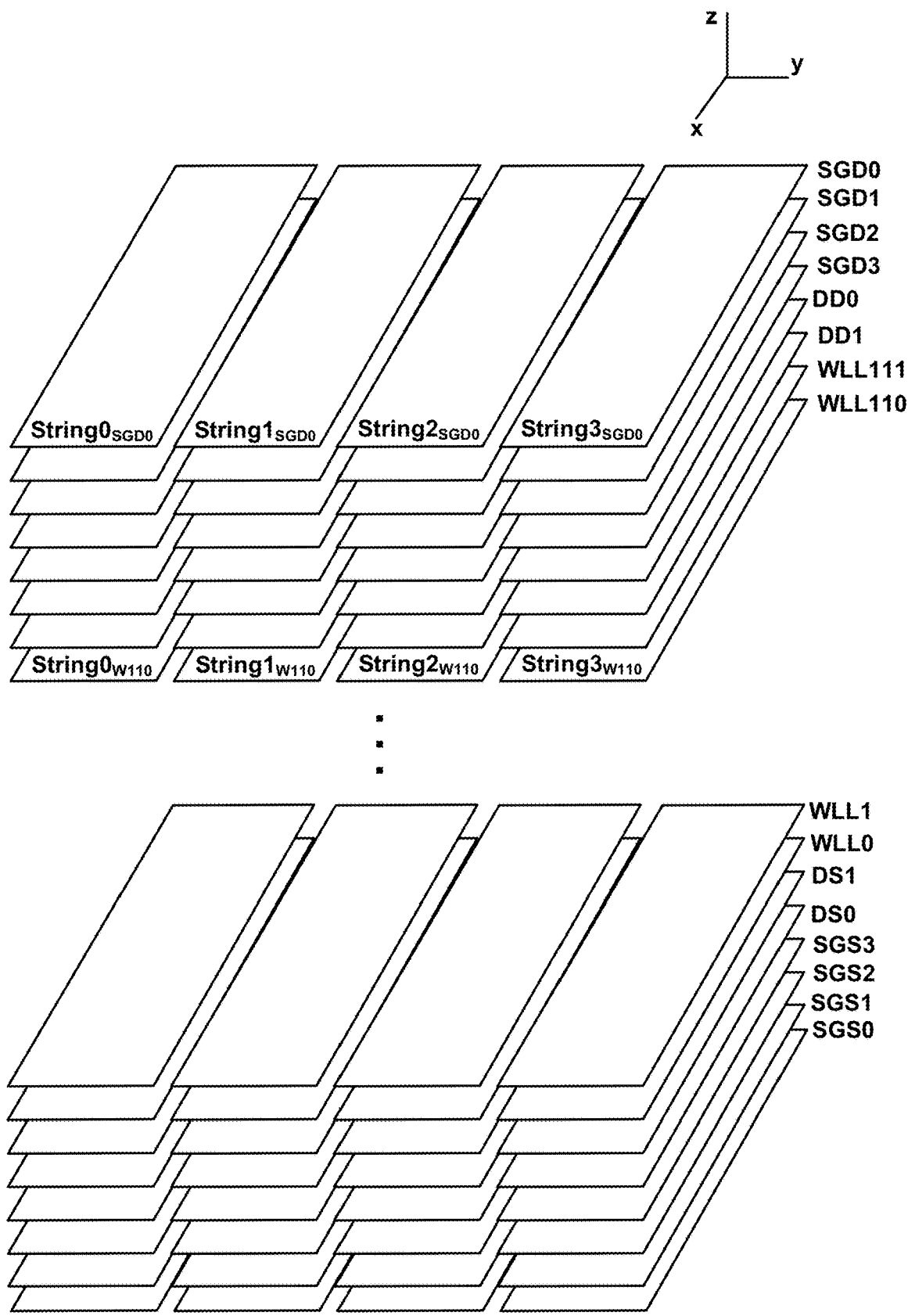
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL111) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL110 is divided into regions $String0_{WL110}$, $String1_{WL110}$, $String2_{WL110}$ and $String3_{WL110}$. In an embodiment, the four word line fingers on a same level are connected together. In another embodiment, each word line finger operates as a separate word line.

Likewise, drain side select gate layer SGD0 (the top layer) is divided into regions $Strin0_{SGD0}$, $String1_{SGD0}$, $String2_{SGD0}$ and $String3_{SGD0}$, also known as fingers or select line fingers. In an embodiment, the four select line fingers on a same level are connected together. In another embodiment, each select line finger operates as a separate word line.

Figure 4E:
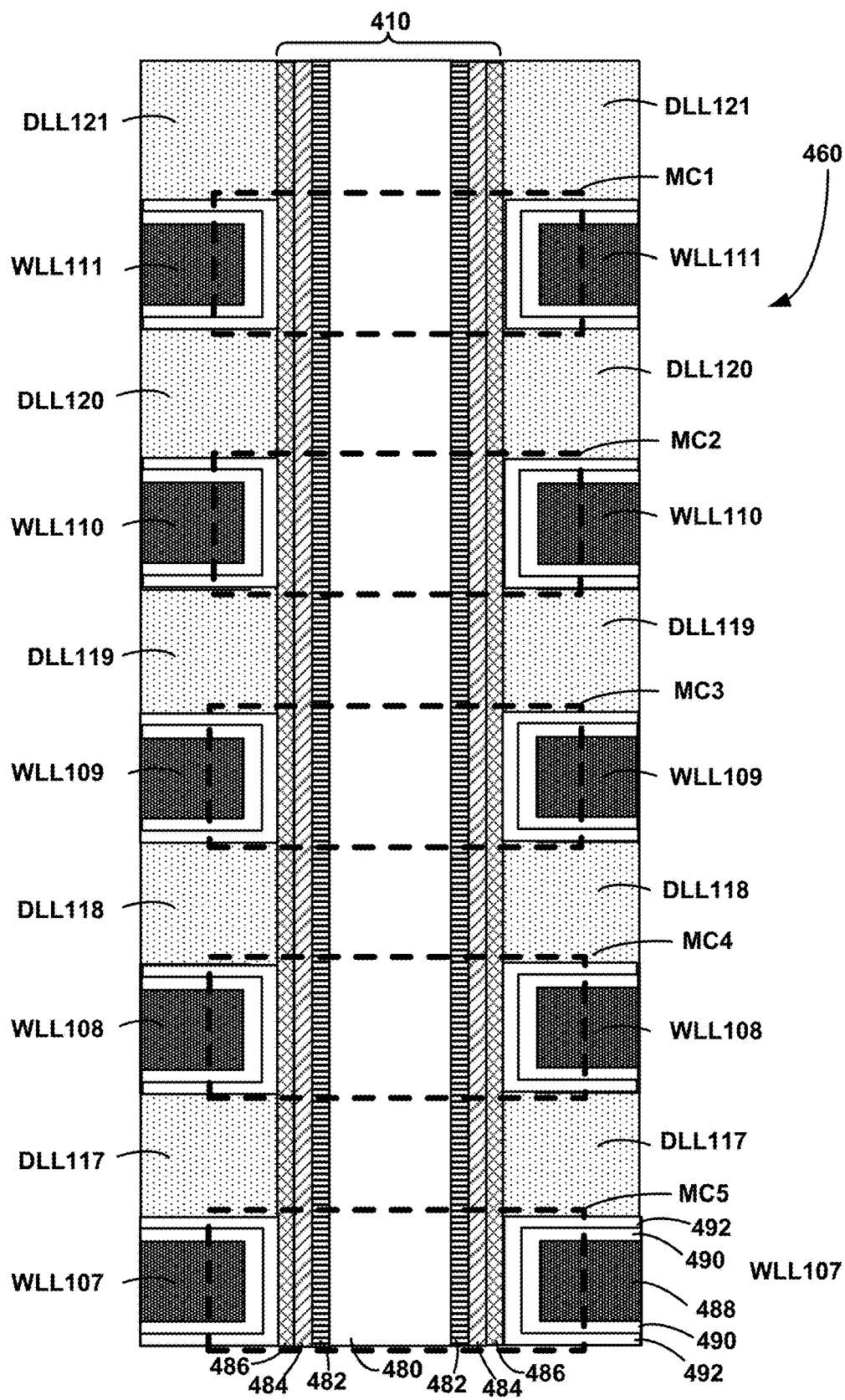
FIG. 4E is a cross sectional view of a memory hole of memory cells.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL121, DLL120, DLL119, DLL118 and DLL117, as well as word line layers WLL107, WLL108, WLL109, WLL110, and WLL111. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL111 and a portion of memory hole 410 comprise a memory cell MC1. Word line layer WLL110 and a portion of memory hole 410 comprise a memory cell MC2. Word line layer WLL109 and a portion of memory hole 410 comprise a memory cell MC3. Word line layer WLL108 and a portion of memory hole 410 comprise a memory cell MC4. Word line layer WLL107 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
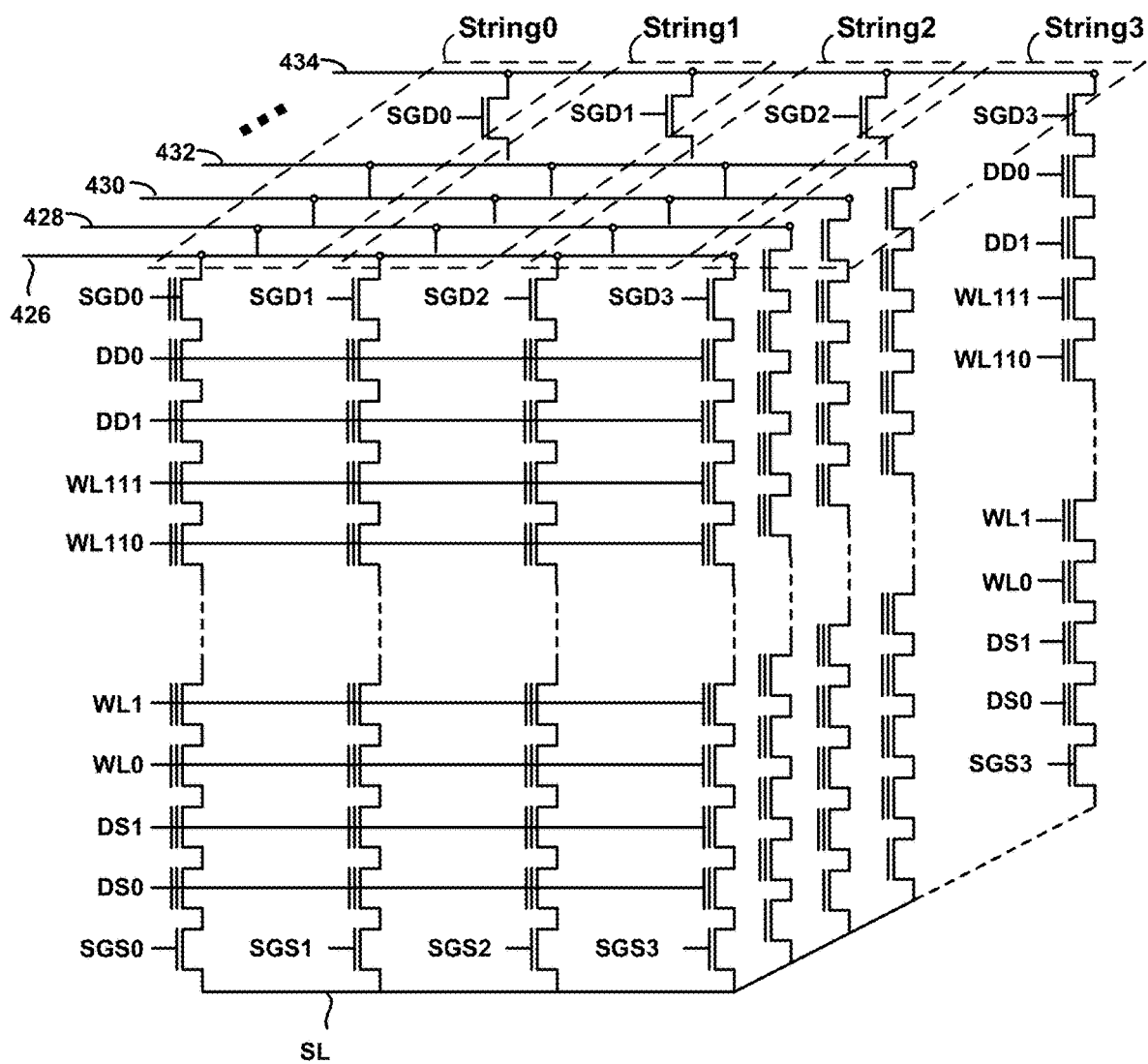
FIG. 4F is a schematic of a plurality of NAND strings.

FIG. 4F is a schematic diagram of corresponding to portion 402 in Block 2 of FIGS. 4A-E, including bit lines 426, 428, 430, 432, . . . 434, and word lines WLL0-WLL111. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

Figure 5A:
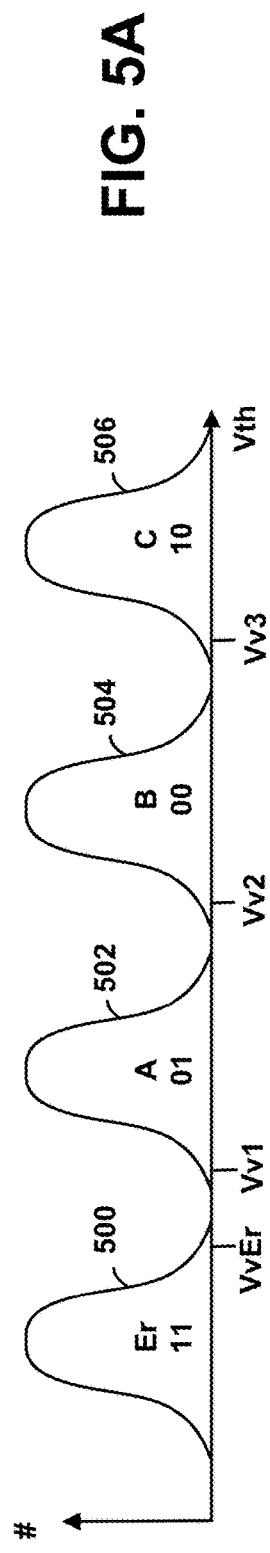
FIG. 5A depicts an embodiment of threshold voltage distributions for a four-state memory device in which each memory cell stores two bits of data.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 540 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

Figure 5B:
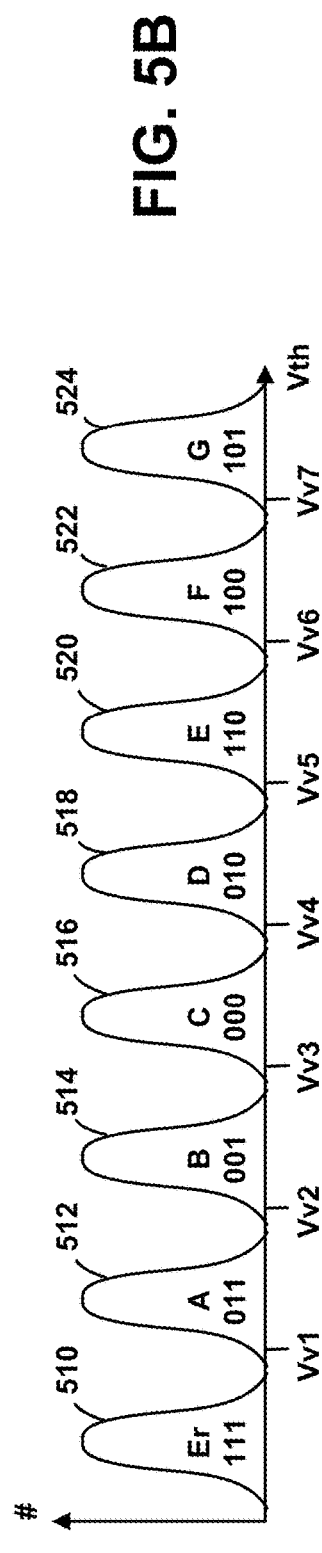
FIG. 5B depicts an embodiment of threshold voltage distributions for an eight-state memory device in which each memory cell stores three bits of data.

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "S1," "B," "C," "D," "E," "F" and "G" memory states are respectively represented by "111," "011," "001," "000," "010," "110," "100" and "101."

Figure 5C:
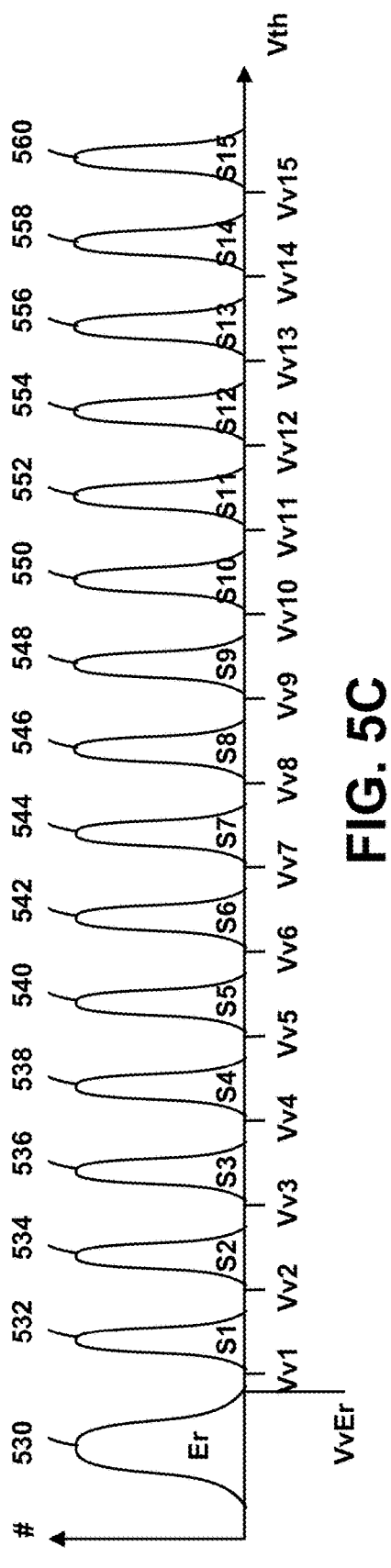
FIG. 5C depicts an embodiment of threshold voltage distributions for a sixteen-state memory device in which each memory cell stores four bits of data.

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the eight memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 104 (FIG. 1) relying on error correction to identify the correct data being stored.

FIGS. 6A-6E illustrate a multi-phase programming approach. In this embodiment, the programming process includes three phases. Prior to programming, the memory cells are erased so that all memory cells connected to a common word line are in an erased threshold voltage distribution Er, as depicted in FIG. 6A.

During the first programming phase, those memory cells whose targets (due to the data to be stored in those memory cells) are data states D, E, F or G are programmed to an intermediate threshold voltage distribution IM. Those memory cells are targeted for data states Er, A, B or C remain in the erased threshold voltage distribution Er. The first phase is graphically depicted in FIG. 6B. Memory cells being programmed to intermediate threshold voltage distribution IM are programmed to a target threshold voltage of VvIM.

During the second programming phase, those memory cells that are in the erased threshold voltage distribution Er are programmed to their target data states. For example, those memory cells to be programmed to data state C are programmed from erased threshold voltage distribution Er to data state C, those memory cells to be programmed to data state B are programmed from erased threshold voltage distribution Er to data state B, those memory cells to be programmed to data state A are programmed from erase threshold voltage distribution Er to data state A, and those memory cells to be in data state Er are not programmed during the second phase of the programming process.

Also, during the second programming phase, those memory cells that are in the intermediate state threshold voltage distribution IM are programmed to their target data states. For example, those memory cells to be programmed to data state G are programmed from intermediate threshold voltage distribution IM to data state G, those memory cells to be programmed to data state F are programmed from intermediate threshold voltage distribution IM to data state F, those memory cells to be programmed to data state E are programmed from intermediate threshold voltage distribution IM to data state E, and those memory cells to be in data state D are programmed from intermediate threshold voltage distribution IM to data state D. This second programming phase is illustrated in FIG. 6C.

As can be seen in FIG. 6C, at the end of the second programming phase data states A-G overlap with neighboring data states. For example, data state A overlaps with data state B, data state B overlaps with data states A and C, data state C overlaps with data states B and S4, data state D overlaps with data states C and E, data state E overlaps with data states D and F, and data state F overlaps with data states E and G. In some embodiments, all or some of the data states do not overlap.

In the third programming phase, each of data states A-G are tightened so that they no longer overlap with neighboring states. This is depicted graphically by FIG. 6D. The final result of the three phrase programming process is depicted in FIG. 6E, which shows data states Er-G. In some embodiments, data state Er is wider than data states A-G. In an embodiment, the data states of FIGS. 6A-6E may be encoded according to the example values depicted in FIG. 5B.

In some embodiments, those memory cells to be programmed to data state D are not programmed during the second phase and, therefore, remain in intermediate threshold voltage distribution IM. During the third programming phase, the memory cells are programmed from intermediate threshold voltage distribution IM to D. In other embodiments, memory cells destined for other states can also remain in intermediate threshold voltage distribution IM or erase threshold voltage distribution Er during the second phase.

Figure 7:
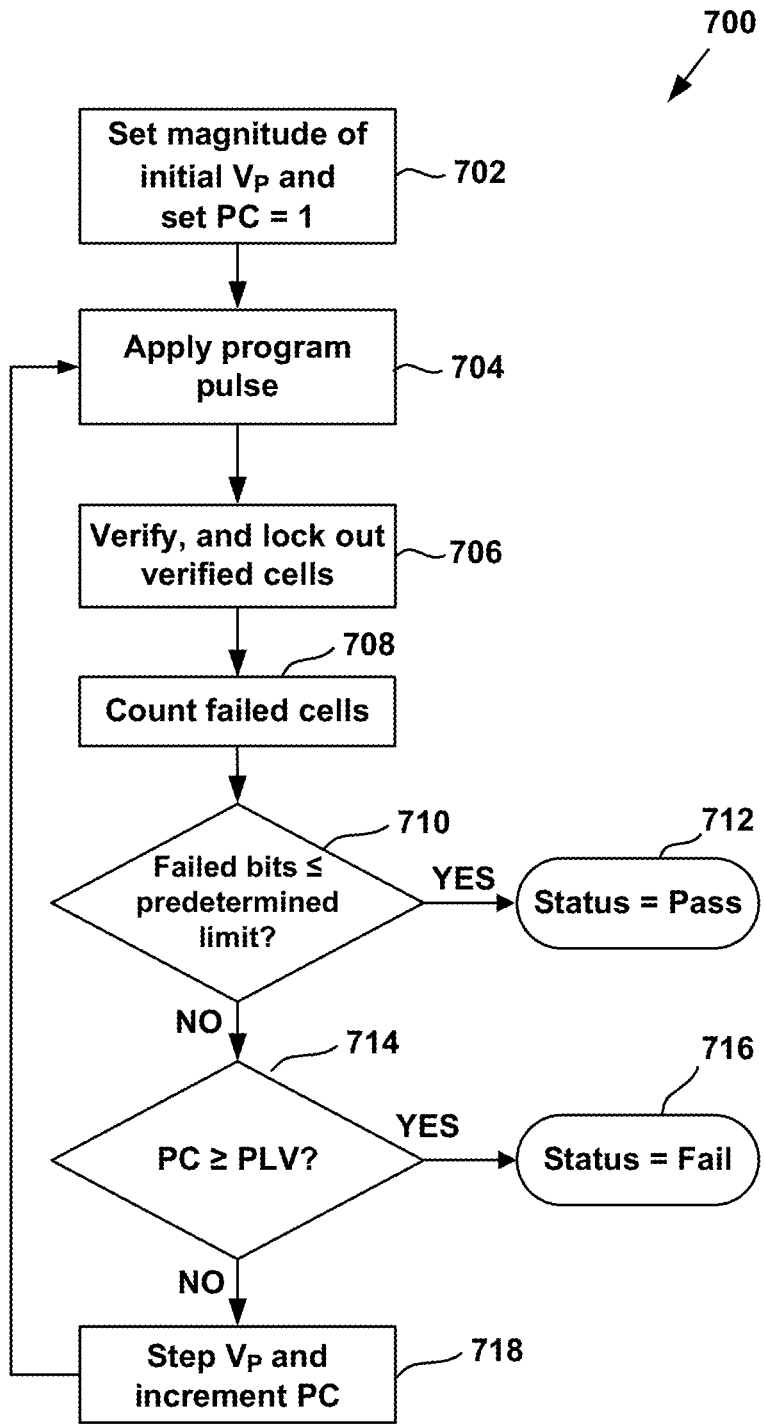
FIG. 7 is a flowchart describing an embodiment of a process for programming non-volatile memory.

FIG. 7 is a flowchart describing an embodiment of a process 700 for programming a memory cell. In an example embodiment, process 700 is performed on memory die 106 (FIG. 1) using the control circuits discussed above. For example, process 700 can be performed at the direction of state machine 216 (FIG. 2). Process 700 also can be used to implement the full sequence programming discussed above. Additionally, process 700 can be used to implement each phase of a multi-phase programming process.

Typically, a program voltage is applied to the control gates (via a selected word line) during a program operation as a series of program pulses. Between programming pulses are a set of verify pulses to perform verification. In many implementations, the magnitude of the program pulses increase with each successive program pulse by a predetermined program step size. This programming technique is sometimes called incremental step pulse programming (ISPP).

In step 702 of process 700, a programming voltage ($V_P$) is initialized to a starting program voltage $V_{Pinit}$ (e.g., between about 12V to about 16V, or some other value) and a program counter PC maintained by state machine 216 is initialized at 1.

In step 704, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 704, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 706, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 708, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 710, a determination is made whether the count from step 708 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 712. In this situation, enough memory cells programmed correctly such that the few remaining memory cells that have not been completely programmed can be corrected using ECC during the read process.

In some embodiments, the predetermined limit used in step 710 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 714 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 716.

If the program counter PC is not greater than or equal to program limit value PLV, then the process continues at step 720 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value). The process loops back to step 704 and another program pulse is applied to the selected word line so that another iteration (steps 704-718) of programming process 700 is performed. Each pass through steps 704-718 is referred to herein as a "program loop."

In general, during verify operations and read operations, the selected word line is connected to a voltage (one example of a reference signal), a level of which is specified for each read operation or verify operation (e.g. verify target levels Vv1, Vv2, Vv3, Vv4, Vv5, Vv6, and Vv7 of FIG. 5B) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 704 a program pulse is applied to the selected word line, and at step 706 memory cells coupled to the selected word line are verified using an appropriate set of verify reference voltages to perform one or more verify operations. Steps 704 and 706 are part of an iterative loop in which program pulses are applied as a series of program pulses that step up in magnitude, with intervening verify reference pulses between consecutive program pulses. Such an iterative loop is referred to herein as a "program-verify iteration."

Figure 8:
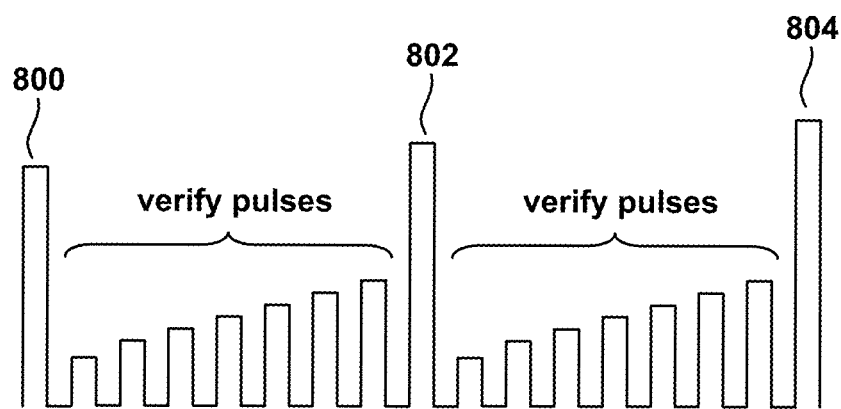
FIG. 8 depicts a word line voltage during programming and verify operations.

FIG. 8 illustrates an example of such program-verify pulses applied to a selected word line. In particular, FIG. 8 depicts program pulses 800, 802 and 804 applied to the selected word line during three successive iterations of step 704 of FIG. 7. Between program pulses 800, 802 and 804 verify pulses are applied to the selected word line during three successive program-verify iterations of steps 704-706 of FIG. 7 to determine whether threshold voltages of the memory cells are greater than the respective verify reference voltages.

FIG. 8 shows a verify pulse for each of the programmed states S1-S7 between each of program pulses 800, 802 and 804. These verify pulses consume a significant portion of a program operation. As the number of programmed states stored per memory cell increases, this situation becomes worse, limiting programming speed. FIG. 8 corresponds to memory cells that store 3-bits per cell and require 7 verify levels. In a 4-bit per cell embodiment, a verify of all non-erased states would need 15 verify operations between program pulses.

To improve performance, some verify operations can be omitted during the programming operation through use of smart-verify algorithms to reduce programming time. For example, an embodiment a smart-verify operation for word line WLn performs a program-verify iteration on memory cells of String0 coupled to word line WLn.

In an embodiment, the program-verify iteration determines a minimum number of program loops (referred to herein as "smart-verify loop count") needed to program memory cells of String® to a particular programmed state (e.g., the lowest programmed state A in FIG. 5B or 6E). The process of determining a smart-verify loop count is also referred to herein as "smart-verify acquisition," and the determined smart-verify loop count is also referred to herein as the acquired smart-verify loop count.

The acquired smart-verify loop count is then used to determine a smart-verify starting program voltage for programming memory cells of String1-String3 coupled to word line WLn. In particular, the smart-verify starting program voltage $V_{PSn}$ for memory cells of String1-String3 coupled to word line WLn is:

$$V_{PS} = V_{Pinit} + \text{SVloop}_n \times \Delta V_{PS} \quad (1)$$

where $\text{SVloop}_n$ is the acquired smart-verify loop count for word line WLn, and $\Delta V_{PS}$ is a program step size for smart-verify (e.g., a step size of between about 0.1V to about 1.0V, or some other value). That is, the determined smart-verify starting program voltage $V_{PSn}$ for memory cells of String1-String3 coupled to word line WLn is initial program voltage $V_{Pinit}$ plus the acquired smart-verify loop count multiplied by program step size for smart-verify $\Delta V_{PS}$. In some embodiments, program step size for smart-verify $\Delta V_{PS}$ may have a same or a different value than program step size $\Delta V_P$. For example, in an embodiment program step size for smart-verify $\Delta V_{PS}$ is less than program step size $\Delta V_P$.

This same process is repeated for each subsequent word line (e.g., word lines WLn+1, WLn+2, ...), first performing a program-verify iteration on memory cells of String® coupled to the word line to acquire a smart-verify loop count for those memory cells, and then using the acquired smart-verify loop count to determine a smart-verify starting program voltage $V_{PSn}$ for programming memory cells of String1-String3 coupled to the word line.

As described above, a multi-state flash memory cell may be used to store multi-state data. For example, an MLC memory cell may be used to store 2 bits per memory cell and may be used to represent four data states, a TLC memory cell may be used to store 3 bits per memory cell and may be used to represent eight data states, and a QLC memory cell may be used to store 4 bits per memory cell and may be used to represent sixteen data states.

Traditionally, a memory die (e.g., memory die 106 of FIG. 1 or memory die 200 of FIG. 2) includes a memory structure (e.g., memory structure 202 of FIG. 2) that includes non-volatile memory cells that are configured to store a fixed number of bits per memory cell. For example, the memory cells in memory structure 202 may be configured as MLC memory cells, or TLC memory cells, or QLC memory cells.

Some storage systems (e.g., storage system 100 of FIG. 1) may include multiple memory die 106, in which some memory die include memory cells configured to store a first number of bits per memory cell, and other memory die include memory cells configured to store a second number of bits per memory cell. For example, a first memory die (e.g., memory die 200 of FIG. 2) includes first memory cells and a first set of logic circuits (e.g., logic circuits 222 of FIG. 2) to implement TLC functions to store 3-bit data (referred to herein as "X3 logic circuits") in each first memory cell, and a second memory die and a second set of logic circuits (e.g., logic circuits 222 of FIG. 2) to implement QLC functions to store 4-bit data (referred to herein as "X4 logic circuits") in each second memory cell.

In many instances, the first memory cells and the second memory cells are the same type of memory cells, and only the logic circuits (e.g., logic circuits 222 of FIG. 2) (X3 logic circuits or X4 logic circuits) differ to store either 3-bit data or 4-bit data in the memory cells. Because the same type of memory cells may be used for storing 3-bit data or 4-bit data, it would be desirable to have a single memory die that includes memory cells that may be programmed as TLC memory cells or QLC memory cells. That is, the single memory die could be used for TLC or QLC programming depending on a specific use requirement.

Memory cells on a single memory die, however, typically have not been configurable as TLC memory cells or QLC memory cells. This is because the complexity of the design—X3 logic circuits and X4 logic circuits typically are very different from one another. One approach to providing a single memory die that includes memory cells that support TLC and QLC functions is to include both X3 logic circuits and X4 logic circuits on the same memory die. Such a solution, however, is not practical because the amount of die area required to provide both X3 logic circuits and X4 logic circuits is prohibitively large and expensive.

Technology is described for providing a single memory die that includes memory cells that may be configured as TLC or QLC memory cells without including both X3 logic circuits and X4 logic circuits on the same memory die. In an embodiment, a memory die includes memory cells and X4 logic circuits that are used to produce QLC and TLC functionality on the memory die. In an embodiment, the X4 logic circuits may implement a QLC programming algorithm (gray code and logic) to program 4-bit data in each memory cell. In an embodiment, the X4 logic circuits also may implement a TLC programming algorithm (gray code and logic) based on the QLC programming algorithm to program 3-bit data in each memory cell.

In an embodiment, an existing QLC gray code is used to generate a TLC gray code. FIG. 9A1 is a table of an example QLC gray code 900a1 used to represent sixteen data states. In particular, QLC gray code 900a depicts values for lower page (LP), middle page (MP), upper page (UP) and top page (TP) bits for sixteen data states S0, S1, ..., S15. For example, for state S3 the LP, MP, UP and TP bits are 1101, respectively, for state S9 the LP, MP, UP and TP bits are 0010, respectively, and so on.

Example QLC gray code 900*a*1 is sometimes referred to as a "3-4-4-4 code," which refers to the number of read levels for each page, where a read level usually occurs at a transition from 0 to 1 or 1 to 0. So in the example of FIG. 9A1, there are 3 read levels for LP (S4 to S5 transition, S10 to S11 transition, and S13 to S14 transition), 4 read levels for MP (S3 to S4 transition, S5 to S6 transition, S8 to S9 transition and S14 to S15 transition), 4 read levels for UP (S1 to S2 transition, S7 to S8 transition, S9 to S10 transition and S11 to S12 transition), and 4 read levels for TP (S0 to S1 transition, S2 to S3 transition, S6 to S7 transition and S12 to S13 transition). Persons of ordinary skill in the art will understand that QLC gray codes other than the example QLC gray code 900*a*1 of FIG. 9A1 may be used.

In embodiments, a TLC gray code is generated from a QLC gray code by setting all bits of one of LP, MP, UP and TP to 1 or 0. In an embodiment, a control circuit (e.g., one or more of control circuitry 204, read/write circuits 206, row decoder 208 and column decoder 210) sets UP=1. QLC gray code 900*a*1 shows in dashed line all data states with UP=1. FIG. 9A2 is a table of an example TLC gray code 900*a*2 which may be generated from the example QLC gray code 900*a*1 of FIG. 9A1 by setting UP=1. That is, UP=1 for QLC data states S0, S1, S8, S9 and S12-S15. User data is input as three pages of data to LP, MP and TP, as shown in FIG. 9A2.

The example TLC gray code 900*a*2 is sometimes referred to as a "2-3-2 code," which refers to the number of read levels for each page, where a read level usually occurs at a transition from 0 to 1 or 1 to 0. So in the example of FIG. 9A2, there are 3 read levels for LP (S1 to S8 transition, S9 to S12 transition, and S13 to S14 transition), 2 read levels for MP (S8 to S9 transition and S14 to S15 transition), and 2 read levels for TP (S0 to S1 transition and S12 to S13 transition).

FIG. 9A3 depicts an embodiment of threshold voltage Vth distributions for an using example TLC gray code 900*a*2 generated from the example QLC gray code 900*a*1 of FIG. 9A1 with UP=1. As depicted in the example, states S2-S7 and S10-S11 have no memory cells assigned to those states. Thus, the following 8 states remain: S0, S1, S8, S9, S12, S13, S14 and S15, which are assigned as TLC states "Er," "A,", "B," "C," "D," "E," "F," and "G," respectively.

In an embodiment, one of the data latches (e.g., the UP data latch) is forced to a value of 1, and then the X4 logic on the memory die implements a QLC program to program memory cells as TLC memory cells. Instead of 16 data states, 8 data states will result, such as depicted in the example threshold voltage Vth distribution FIG. 9A3.

Although the threshold voltage Vth distribution FIG. 9A3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv1, Vv8, Vv9, Vv12, Vv13, Vv14 and Vv15 of the 7 programmed data states S1, S8, S9, S12, S13, S14 and S15, respectively, so that the threshold voltage Vth distribution is more evenly spaced, such as in the example threshold voltage Vth distribution depicted in FIG. 9A4.

In the embodiment depicted in FIGS. 9A1-9A4, a TLC gray code is generated from a QLC gray code by setting all bits of UP to 1. As described above, in embodiments a TLC gray code is generated from a QLC gray code by setting all bits of one of LP, MP, UP and TP to 1 or 0. Thus, in an alternative embodiment, a TLC gray code may be generated from a QLC gray code by setting all bits of UP=0. In an embodiment, a control circuit (e.g., one or more of control circuitry 204, read/write circuits 206, row decoder 208 and column decoder 210) sets UP=0.

For example, FIG. 9B1 is a table of an example QLC gray code 900*b*1 used to represent sixteen data states, and shows in dashed line all data states with UP=0. FIG. 9B2 is a table of an example TLC gray code 900*b*2 which may be generated from the example QLC gray code 900*b*1 of FIG. 9B1 by setting UP=0. That is, UP=0 for QLC data states S2-S7 and S10-S11. User data is input as three pages of data to LP, MP and TP, as shown in FIG. 9B2.

FIG. 9B3 depicts an embodiment of threshold voltage Vth distributions for an eight-state memory device in which each memory cell stores three bits of data, programmed using example TLC gray code 900*b*2 generated from the example QLC gray code 900*b*1 of FIG. 9B1 with UP=0. As depicted in the example, states S0-S1, S8-S9 and S12-S15 have no memory cells assigned to those states. Thus, the following 8 states remain: S2, S3, S4, S5, S6, S7, S10 and S11, which are assigned as TLC states "Er," "A,", "B," "C," "D," "E," "F," and "G," respectively.

In an embodiment, one of the data latches (e.g., the UP data latch) is forced to a value of 0, and then the X4 logic on the memory die implements a QLC program to program memory cells as TLC memory cells. Instead of 16 data states, 8 data states will result, such as the example threshold voltage Vth distribution depicted in FIG. 9B3.

Although the threshold voltage Vth distribution FIG. 9B3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv2, Vv3, Vv4, Vv5, Vv6, Vv7, Vv10 and Vv11 of the 8 programmed data states S2, S3, S4, S5, S6, S7, S10 and S11, respectively, so that the threshold voltage Vth distribution is more evenly spaced, such as in the example threshold voltage Vth distribution depicted in FIG. 9B4.

FIGS. 9C1-9C4 depict yet another alternative embodiment in which a TLC gray code is generated from a QLC gray code by setting all bits of TP=1. In an embodiment, a control circuit (e.g., one or more of control circuitry 204, read/write circuits 206, row decoder 208 and column decoder 210) sets TP=1.

FIG. 9C1 is a table of an example QLC gray code 900*c*1 used to represent sixteen data states, and shows in dashed line all data states with TP=1. FIG. 9C2 is a table of an example TLC gray code 900*c*2 which may be generated from the example QLC gray code 900*c*1 of FIG. 9C1 by setting TP=1. That is, TP=1 for QLC data states S0, S3-S6, and S13-S15. User data is input as three pages of data to LP, MP and TP, as shown in FIG. 9C2.

FIG. 9C3 depicts an embodiment of threshold voltage Vth distributions for an eight-state memory device in which each memory cell stores three bits of data, programmed using example TLC gray code 900*c*2 generated from the example QLC gray code 900*c*1 of FIG. 9C1 with TP=1. As depicted in the example, states S1-S2 and S7-S12 have no memory cells assigned to those states. Thus, the following 8 states remain: S0, S3, S4, S5, S6, S13, S14 and S15, which are assigned as TLC states "Er," "A,", "B," "C," "D," "E," "F," and "G," respectively.

In an embodiment, one of the data latches (e.g., the TP data latch) is forced to a value of 1, and then the X4 logic on the memory die implements a QLC program to program memory cells as TLC memory cells. Instead of 16 data states, 8 data states will result, such as depicted in the example threshold voltage Vth distribution FIG. 9C3.

Although the threshold voltage Vth distribution FIG. 9C3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv3, Vv4, Vv5, Vv6, Vv13, Vv14 and Vv15 of the 8 programmed data states S3, S4, S5, S6, S13, S14 and S15, respectively, so that the threshold voltage Vth distribution is more evenly spaced, such as in the example threshold voltage Vth distribution depicted in FIG. 9C4.

FIGS. 9D1-9D4 depict still another alternative embodiment in which a TLC gray code is generated from a QLC gray code by setting all bits of TP=0. In an embodiment, a control circuit (e.g., one or more of control circuitry 204, read/write circuits 206, row decoder 208 and column decoder 210) sets TP=0.

FIG. 9D1 is a table of an example QLC gray code 900d1 used to represent sixteen data states, and shows in dashed line all data states with TP=0. FIG. 9D2 is a table of an example TLC gray code 900d2 which may be generated from the example QLC gray code 900d1 of FIG. 9D1 by setting TP=0. That is, TP=0 for QLC data states S1-S2 and S7-S12. User data is input as three pages of data to LP, MP and TP, as shown in FIG. 9D2.

FIG. 9D3 depicts an embodiment of threshold voltage Vth distributions for an using example TLC gray code 900d2 generated from the example QLC gray code 900d1 of FIG. 9D1 with TP=0. As depicted in the example, states S0, S3-S6 and S13-S15 have no memory cells assigned to those states. Thus, the following 8 states remain: S1, S2, S7, S8, S9, S10, S11 and S12, which are assigned as TLC states "Er," "A,", "B," "C," "D," "E," "F," and "G," respectively.

In an embodiment, one of the data latches (e.g., the TP data latch) is forced to a value of 0, and then the X4 logic on the memory die implements a QLC program to program memory cells as TLC memory cells. Instead of 16 data states, 8 data states will result, such as depicted in FIG. 9D3.

Although the threshold voltage Vth distribution FIG. 9D3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv1, Vv2, Vv7, Vv8, Vv9, Vv10, Vv11 and Vv12 of the 8 programmed data states S1, S2, S7, S8, S9, S10, S11 and S12, respectively, so that the threshold voltage Vth distribution is more evenly spaced, such as in the example threshold voltage Vth distribution depicted in FIG. 9D4.

FIGS. 9E1-9E4 depict yet another alternative embodiment in which a TLC gray code is generated from a QLC gray code by setting all bits of MP=1. In an embodiment, a control circuit (e.g., one or more of control circuitry 204, read/write circuits 206, row decoder 208 and column decoder 210) sets MP=1.

FIG. 9E1 is a table of an example QLC gray code 900e1 used to represent sixteen data states, and shows in dashed line all data states with MP=1. FIG. 9E2 is a table of an example TLC gray code 900e2 which may be generated from the example QLC gray code 900e1 of FIG. 9E1 by setting MP=1. That is, MP=1 for QLC data states S0-S3, S6-S8 and S15. User data is input as three pages of data to LP, MP and TP, as shown in FIG. 9E2.

FIG. 9E3 depicts an embodiment of threshold voltage Vth distributions for an using example TLC gray code 900e2 generated from the example QLC gray code 900e1 of FIG. 9E1 with MP=1. As depicted in the example, states S4-S5 and S9-S14 have no memory cells assigned to those states. Thus, the following 8 states remain: S0, S1, S2, S3, S6, S7, S8 and S15, which are assigned as TLC states "Er," "A,", "B," "C," "D," "E," "F," and "G," respectively.

In an embodiment, one of the data latches (e.g., the MP data latch) is forced to a value of 1, and then the X4 logic on the memory die implements a QLC program to program memory cells as TLC memory cells. Instead of 16 data states, 8 data states will result, such as depicted in FIG. 9E3.

Although the threshold voltage Vth distribution FIG. 9E3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv1, Vv2, Vv3, Vv6, Vv7, Vv8 and Vv15 of the 8 programmed data states S1, S2, S3, S6, S7, S8 and S15, respectively, so that the threshold voltage Vth distribution is more evenly spaced, such as in the example threshold voltage Vth distribution depicted in FIG. 9E4.

FIGS. 9F1-9F4 depict still another alternative embodiment in which a TLC gray code is generated from a QLC gray code by setting all bits of MP=0. In an embodiment, a control circuit (e.g., one or more of control circuitry 204, read/write circuits 206, row decoder 208 and column decoder 210) sets MP=0.

FIG. 9F1 is a table of an example QLC gray code 900f1 used to represent sixteen data states, and shows in dashed line all data states with MP=0. FIG. 9F2 is a table of an example TLC gray code 900f2 which may be generated from the example QLC gray code 900f1 of FIG. 9F1 by setting MP=0. That is, MP=0 for QLC data states S4-S5 and S9-S14. User data is input as three pages of data to LP, MP and TP, as shown in FIG. 9F2.

FIG. 9F3 depicts an embodiment of threshold voltage Vth distributions for an using example TLC gray code 900f2 generated from the example QLC gray code 900f1 of FIG. 9F1 with MP=0. As depicted in the example, states S0-S3, S6-S8 and S15 have no memory cells assigned to those states. Thus, the following 8 states remain: S4, S5, S9, S10, S11, S12, S13 and S14, which are assigned as TLC states "Er," "A,", "B," "C," "D," "E," "F," and "G," respectively.

In an embodiment, one of the data latches (e.g., the MP data latch) is forced to a value of 0, and then the X4 logic on the memory die implements a QLC program to program memory cells as TLC memory cells. Instead of 16 data states, 8 data states will result, such as depicted in FIG. 9F3.

Although the threshold voltage Vth distribution FIG. 9F3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv4, Vv5, Vv9, Vv10, Vv11, Vv12, Vv13 and Vv14 of the 8 programmed data states S4, S5, S9, S10, S11, S12, S13 and S14, respectively, so that the threshold voltage Vth distribution is more evenly spaced, such as in the example threshold voltage Vth distribution depicted in FIG. 9F4.

FIGS. 9G1-9G4 depict yet another alternative embodiment in which a TLC gray code is generated from a QLC gray code by setting all bits of LP=1. In an embodiment, a control circuit (e.g., one or more of control circuitry 204, read/write circuits 206, row decoder 208 and column decoder 210) sets LP=1.

In particular, FIG. 9G1 is a table of an example QLC gray code 900g1 used to represent sixteen data states, and shows in dashed line all data states with LP=1. FIG. 9G2 is a table of an example TLC gray code 900g2 which may be generated from the example QLC gray code 900g1 of FIG. 9G1 by setting LP=1. That is, LP=1 for QLC data states S0-S4 and S11-S13. User data is input as three pages of data to LP, MP and TP, as shown in FIG. 9G2.

FIG. 9G3 depicts an embodiment of threshold voltage Vth distributions for an using example TLC gray code 900g2 generated from the example QLC gray code 900g1 of FIG. 9G1 with LP=1. As depicted in the example, states S5-S10 and S14-S15 have no memory cells assigned to those states. Thus, the following 8 states remain: S0, S1, S2, S3, S4, S11, S12 and S13, which are assigned as TLC states "Er," "A,", "B," "C," "D," "E," "F," and "G," respectively.

In an embodiment, one of the data latches (e.g., the LP data latch) is forced to a value of 1, and then the X4 logic on the memory die implements a QLC program to program memory cells as TLC memory cells. Instead of 16 data states, 8 data states will result, such as depicted in FIG. 9G3.

Although the threshold voltage Vth distribution FIG. 9G3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv1, Vv2, Vv3, Vv4, Vv11, Vv12 and Vv13 of the 8 programmed data states S0, S1, S2, S3, S4, S11, S12 and S13, respectively, so that the threshold voltage Vth distribution is more evenly spaced, such as in the example threshold voltage Vth distribution depicted in FIG. 9G4.

FIGS. 9H1-9H4 depict still another embodiment in which a TLC gray code is generated from a QLC gray code by setting all bits of LP=0. In an embodiment, a control circuit (e.g., one or more of control circuitry 204, read/write circuits 206, row decoder 208 and column decoder 210) sets LP=0.

FIG. 9H1 is a table of an example QLC gray code 900h1 used to represent sixteen data states, and shows in dashed line all data states with LP=0. FIG. 9H2 is a table of an example TLC gray code 900h2 which may be generated from the example QLC gray code 900h1 of FIG. 9H1 by setting LP=0. That is, LP=0 for QLC data states S5-S10 and S14-S15. User data is input as three pages of data to LP, MP and TP, as shown in FIG. 9H2.

FIG. 9H3 depicts an embodiment of threshold voltage Vth distributions for an using example TLC gray code 900h2 generated from the example QLC gray code 900h1 of FIG. 9H1 with LP=0. As depicted in the example, states S0-S4 and S11-S13 have no memory cells assigned to those states. Thus, the following 8 states remain: S5, S6, S7, S8, S9, S10, S14 and S15, which are assigned as TLC states "Er," "A,", "B," "C," "D," "E," "F," and "G," respectively.

In an embodiment, one of the data latches (e.g., the LP data latch) is forced to a value of 0, and then the X4 logic on the memory die implements a QLC program to program memory cells as TLC memory cells. Instead of 16 data states, 8 data states will result, such as depicted in FIG. 9H3.

Although the threshold voltage Vth distribution FIG. 9H3 may be used as is, the threshold voltage Vth distributions alternatively may be spaced more evenly. In an embodiment, a control circuit (e.g., one or more of control circuitry 204, read/write circuits 206, row decoder 208 and column decoder 210) tunes the verify levels Vv5, Vv6, Vv7, Vv8, Vv9, Vv10, Vv14 and Vv15 of the 8 programmed data states S5, S6, S7, S8, S9, S10, S14 and S15, respectively, so that the threshold voltage Vth distribution is more evenly spaced, such as in the example threshold voltage Vth distribution depicted in FIG. 9H4.

One embodiment includes an apparatus that includes a plurality of memory cells, logic circuits coupled to the memory cells and configured to store 4-bit data in each of the memory cells, and a control circuit coupled to the memory cells and the logic circuits. The control circuit configured to cause the logic circuits to store 3-bit data in each of the memory cells.

One embodiment includes a memory system that includes a memory die including a memory cell and a control circuit coupled to the memory cell, the control circuit configured to program the memory cell to any of sixteen possible threshold voltages. The control circuit programs the memory cell to only eight of the sixteen possible threshold voltages.

One embodiment includes a method that includes programming 3-bit data in a memory cell coupled to four data latches by storing the 3-bit data in a first, second and third of the four data latches, forcing a value of a fourth one of the four data latches to 1 or 0, and using a 4-bit gray code to program the 3-bit data in the memory cell.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
   a plurality of memory cells;
   logic circuits coupled to the memory cells and configured to store 4-bit data in each of the memory cells using a 4-bit gray code; and
   a control circuit coupled to the memory cells and the logic circuits, the control circuit configured to cause the logic circuits to use the 4-bit gray code to store only 3-bit data in each of the memory cells using fewer than sixteen possible threshold voltages.

2. The apparatus of claim 1, wherein the logic circuits implement a first programming algorithm to program 4-bit data in each memory cell.

3. The apparatus of claim 2, wherein the first programming algorithm comprises a 4-bit gray code.

4. The apparatus of claim 1, wherein the logic circuits implement a second programming algorithm to program 3-bit data in each memory cell.

5. The apparatus of claim 1, wherein the logic circuits implement a first programming algorithm that comprises 4-bit gray code, and wherein the logic circuits implement a second programming algorithm that comprises a 3-bit gray code based on the 4-bit gray code.

6. The apparatus of claim 1, further comprising a plurality of data latches associated with each of the memory cells, wherein the control circuit is further configured to set a value of one of the data latches to 0 or 1 to store 3-bit data in each of the memory cells.

7. The apparatus of claim 1, wherein each of the memory cells is configured to store 3 bits of data per memory cell and 4 bits of data per memory cell.

8. The apparatus of claim 1, wherein the apparatus does not comprise separate logic circuits configured to store 3-bit data in each of the memory cells.

9. The apparatus of claim 1, wherein the control circuit is further configured to tune verify levels to space a threshold voltage distribution of the memory cells.

10. The apparatus of claim 1, further comprising four data latches associated with each of the memory cells, wherein data to be written to the memory cells are stored only in three of the four data latches.

11. A memory system comprising:
a memory die comprising a memory cell; and
a control circuit coupled to the memory cell, the control circuit configured to:
use a 4-bit gray code to program the memory cell to any of sixteen possible threshold voltages; and
use the 4-bit gray code to store 3-bit data in the memory cell using only eight of the sixteen possible threshold voltages.

12. The memory system of claim 11, wherein the control circuit stores 3-bit data in the memory cell.

13. The memory system of claim 11, wherein the control circuit comprises logic circuits configured to store 4-bit data or 3-bit data in the memory cell.

14. The memory system of claim 11, wherein the control circuit comprises logic circuits that implement a first programming algorithm to program 4-bit data in the memory cell.

15. The memory system of claim 14, wherein the first programming algorithm comprises a 4-bit gray code.

16. The memory system of claim 15, wherein the logic circuits implement a second programming algorithm that comprises a 3-bit gray code based on the 4-bit gray code.

17. The memory system of claim 11, further comprising a plurality of data latches associated with the memory cell, wherein the control circuit is further configured to set a value of one of the data latches to 0 or 1 to store 3-bit data in the memory cell.

18. The memory system of claim 11, wherein the control circuit is further configured to tune verify levels to space a threshold voltage distribution of the memory cell.

19. A method comprising:
programming 3-bit data in a memory cell coupled to four data latches by:
storing the 3-bit data in a first, second and third of the four data latches;
forcing a value of a fourth one of the four data latches to 1 or 0; and
using a 4-bit gray code to program the 3-bit data in the memory cell.

20. The method of claim 19, further comprising generating a 3-bit grey code from the 4-bit gray code.

* * * * *